United States Patent
Kahlman

(10) Patent No.: US 6,265,994 B1
(45) Date of Patent: Jul. 24, 2001

(54) DEVICE FOR ENCODING/DECODING N-BIT SOURCE WORDS INTO CORRESPONDING M-BIT CHANNEL WORDS, AND VICE VERSA

(75) Inventor: Josephus A. H. M. Kahlman, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/403,681
(22) PCT Filed: Jan. 8, 1999
(86) PCT No.: PCT/IB99/00011
§ 371 Date: Sep. 9, 1999
§ 102(e) Date: Sep. 9, 1999
(87) PCT Pub. No.: WO99/35747
PCT Pub. Date: Jul. 15, 1999

(30) Foreign Application Priority Data

Jan. 9, 1998 (EP) .................................. 98200041
Jul. 24, 1998 (EP) .................................. 98202491

(51) Int. Cl.⁷ .................................. H03M 5/00
(52) U.S. Cl. .............. 341/58; 340/347; 360/40; 375/237; 375/238; 375/239
(58) Field of Search .................. 341/58, 57, 53, 341/50, 59, 95, 67, 102, 68, 69, 64

(56) References Cited

U.S. PATENT DOCUMENTS

| | | | |
|---|---|---|---|
| 4,536,472 | * 8/1985 | Immink | 340/347 |
| 4,573,034 | * 2/1986 | Immink | 340/347 |
| 5,477,222 | * 12/1995 | Kahlman et al. | 341/95 |
| 5,781,131 | * 7/1998 | Shimpuku et al. | 341/58 |
| 5,847,665 | * 12/1998 | Tu | 341/50 |
| 6,061,005 | * 5/2000 | Van Rooyen et al. | 341/53 |
| 6,157,327 | * 12/2000 | Akaogi | 341/67 |
| 6,175,318 | * 1/2001 | Kahlman et al. | 341/59 |

* cited by examiner

Primary Examiner—Michael Tokar
Assistant Examiner—Lam T. Mai
(74) Attorney, Agent, or Firm—Michael E. Belk

(57) ABSTRACT

A device is disclosed for encoding a stream of databits of a binary source signal into a stream of databits of a binary channel signal. The device comprises a merging unit (4') for merging a 1-bit merging word at equidistant positions in the serial datastream of the binary source signal, so as to obtain a composite binary source signal. A shuffling step is carried out on the composite binary source signal in a shuffling unit (8'). Next a conversion is carried out in a converter unit (10'), resulting in the channel signal (FIG. 2). Further, a decoding device is disclosed for decoding the channel signal obtained by means of the encoding device.

29 Claims, 10 Drawing Sheets

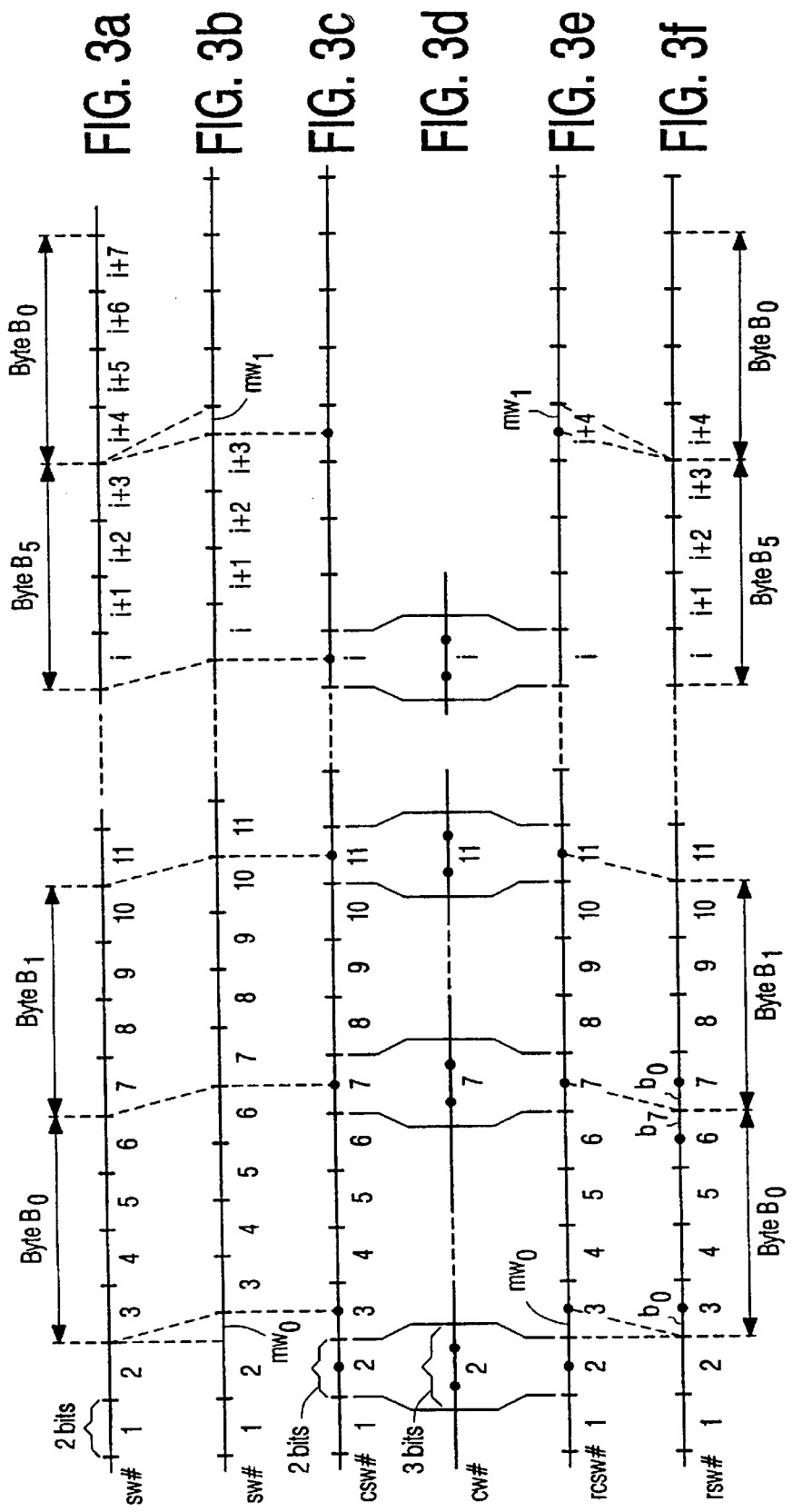

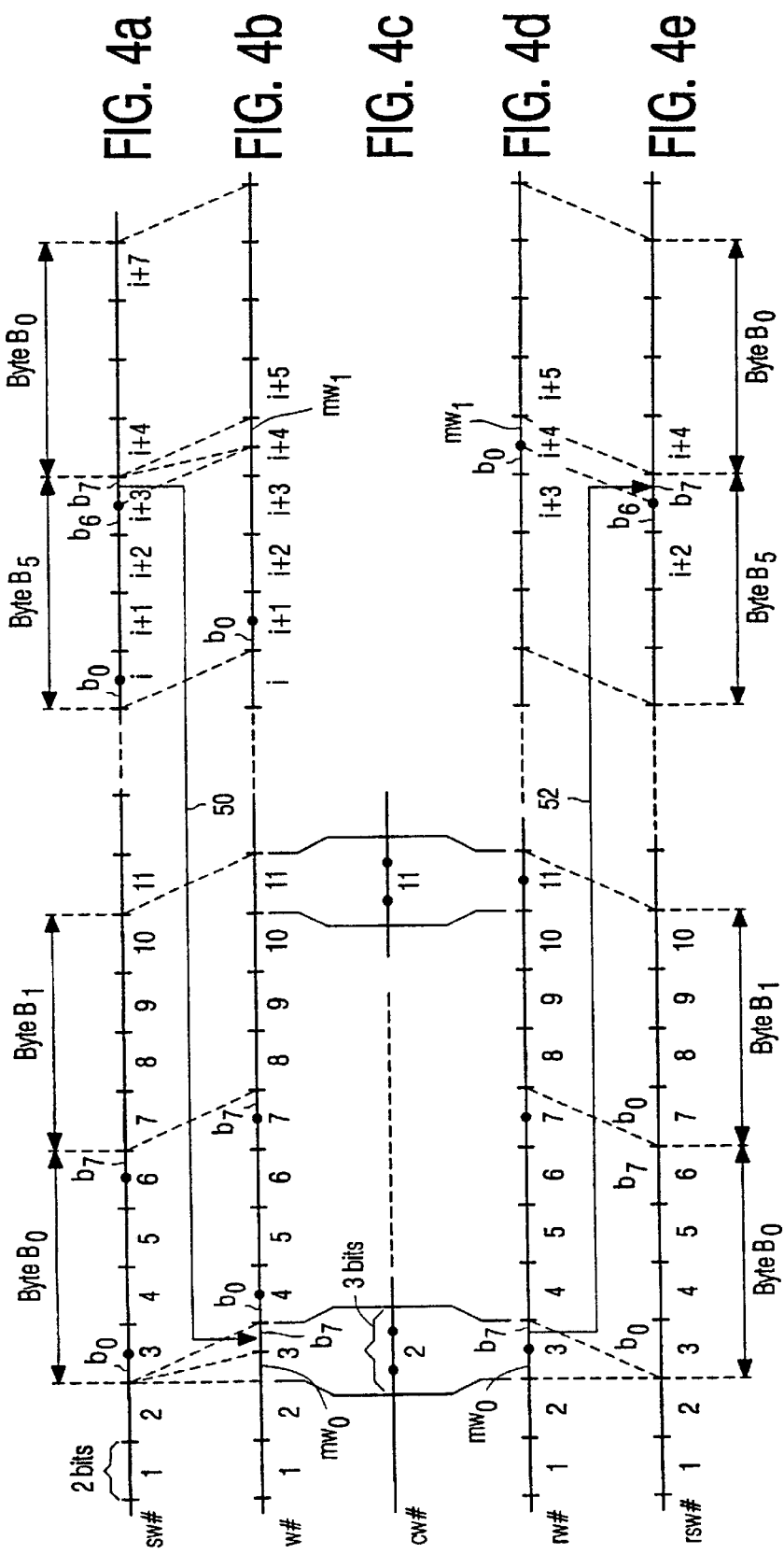

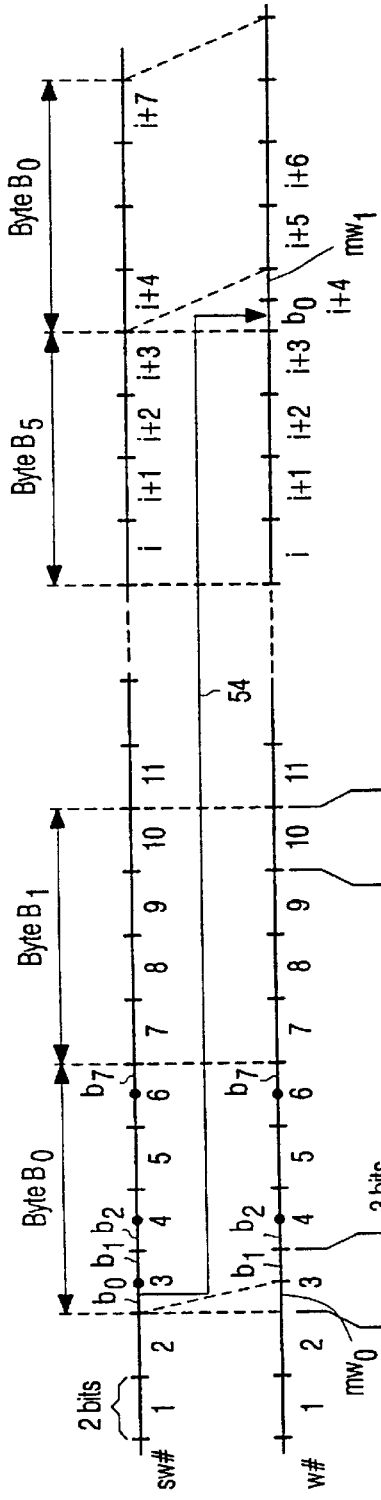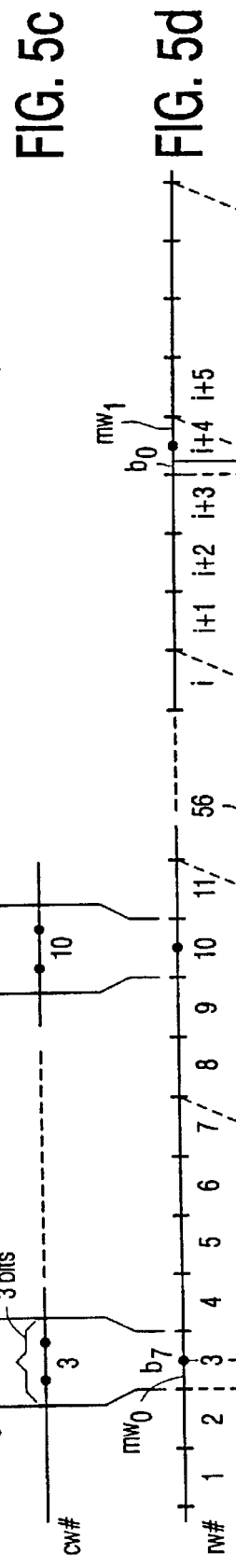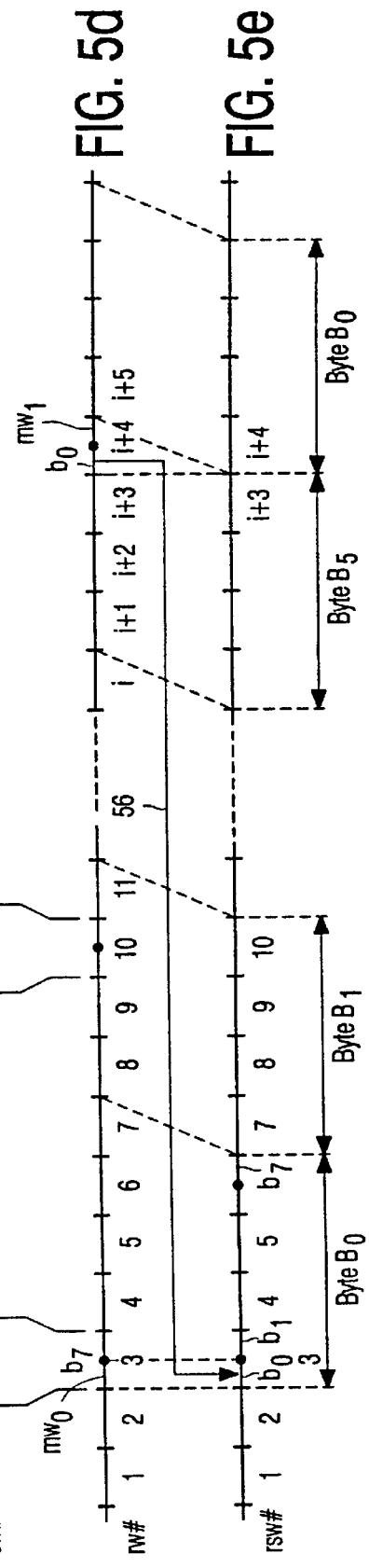
FIG. 5a
FIG. 5b
FIG. 5c
FIG. 5d
FIG. 5e

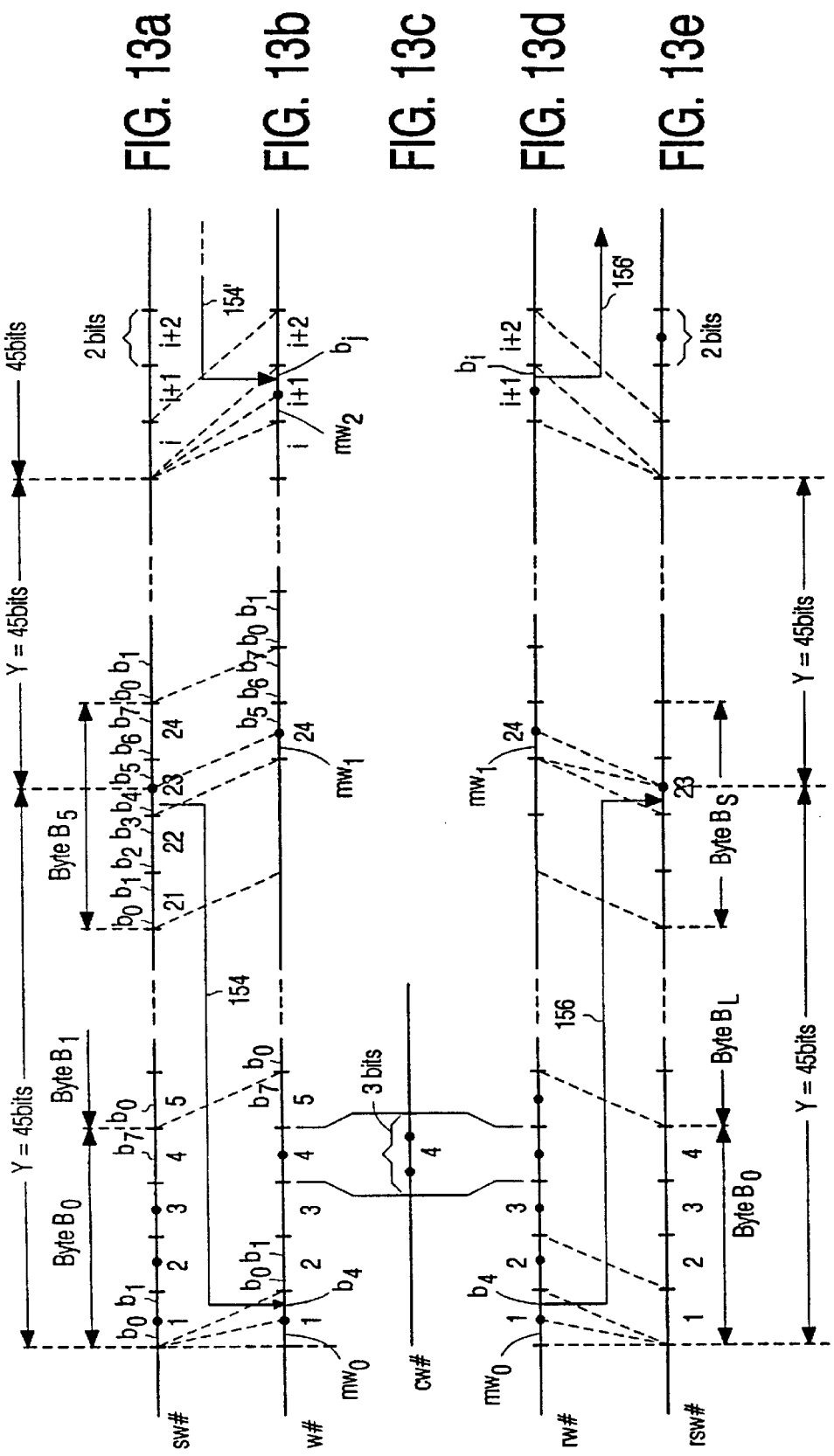

DEVICE FOR ENCODING/DECODING N-BIT SOURCE WORDS INTO CORRESPONDING M-BIT CHANNEL WORDS, AND VICE VERSA

BACKGROUND OF THE INVENTION

The invention relates to a device for encoding a stream of databits of a binary source signal into a stream of databits of a binary channel signal, the device comprising
input means for receiving the binary source signal,
merging means for merging a q-bit merging word at equidistant positions in the binary source signal in response to a control signal, so as to obtain a composite binary source signal,
converting means for converting the composite binary source signal into said binary channel signal,
control signal generator means for generating said control signal,
output means for supplying said binary channel signal. The invention also relates to a device for decoding a stream of data bits of a binary channel signal obtained by means of the encoding device, so as to obtain a stream of databits of a binary source signal, to a recording device comprising the encoding device, to a record carrier obtained with the recording device and to a method of encoding the source signal.

An encoding device mentioned in the foregoing is known U.S. Pat. No. 5,477,222 (PHN 14448). The document discloses a device for encoding a stream of databits of a binary source signal into a stream of databits of a binary channel signal, satsifying a (1,8) runlength constraint. That means that, in a serial datastream of the channel signal at mimimum one 'zero' and at maximum eight 'zeroes' are present between two consecutive 'ones' in the channel signal. It should be noted in this respect that normally an additional precoding step, such as a 1T precoding, is applied to the (1,8) constrained sequence, resulting in a runlength limited sequence with minimum runlength 2 and maximum runlength 9.

The known conversion is parity preserving. 'Parity preserving' means that the parity of the n-bit source words to be converted equal the parity (after modulo-2 addition) of the corresponding m-bit channel words in which they are converted. As a result, the n-to-m conversion device as claimed does not influence the polarity of the signal.

As the conversion is parity preserving, an efficient DC control can be applied, such as by inserting DC control bits in the datastream of the source words.

SUMMARY OF THE INVENTION

The invention has for its object to provide an improved device for encoding n-bit source words into corresponding m-bit channel words.

The device in accordance with the invention comprises . . . copy claim 1 in its entirely]. The invention is based on the following recognition. Without applying the measure in accordance with the invention, the encoding process is as follows. After insertion of the q-bit merging words in the bitstream of the binary source signal, a bitstream of the composite binary source signal has been generated. This composite binary source signal is divided into a sequence of subsequent n-bit words for conversion into m-bit channel words in the converting means. This division into a sequence of n-bit words is done such that one boundary between two subsequent words in the composite binary source signal may lie between a merging word and the subsequent source word of the binary source signal in said composite binary source signal. Until the next merging word, all boundaries between two subsequent words in the composite binary source signal are aligned with the boundaries between the subsequent source words of the binary source signal. The said next merging word forms, together with the first q bits of the next source word in the binary source signal, the next n-bit word in the composite binary source signal. As a result, until the following merging word, all boundaries between two subsequent words in the composite source signal are not aligned anymore with the boundaries of the n-bit source words of the binary source signal. Or, an n-bit word in the composite binary source signal is spread out across two subsequent n-bit source words of the binary source signal.

The n-bit words in the composite binary source signal are converted upon encoding into corresponding m-bit channel words. After transmission and subsequent reception in a receiver provided with a corresponding decoder, the m-bit channel words are decoded into corresponding n-bit words, which n-bit words form a replica of the composite binary source signal. Subsequently, the q-bit merging words are deleted from the composite binary source signal so as to obtain a replica of the binary source signal.

Errors may occur during transmission, resulting in an erroneous decoding in the decoder. An erroneous word in the replica of the composite binary source signal may lead to one erroneous source word in the replica of the binary source signal, namely for those portions of the replica of the binary source signal where the boundaries between two subsequent source words were aligned with the boundaries of two subsequent words of the replica of the composite binary source signal. However, in those portions of the replica of the binary source signal where the boundaries between two subsequent source words are not aligned with the boundaries of two subsequent words of the replica of the composite binary source signal, an erroneous word in the replica of the composite source signal leads to two erroneous words in the replica of the binary source signal.

The invention overcomes this error propagation, in that by shifting q bits in each second group of y consecutive bits source words in the binary source signal, the boundaries between two subsequent n-bit source words of the binary source signal are aligned with the boundaries between two subsequent n-bit words in the composite binary source signal. As a result, no error propagation will occur.

Generally, the channel signal obtained is applied to a 1T-precoder. The purpose of the merging means is to add merging words, such as a 1-bit merging word, that is: a '0'- or a '1' bit, to the consecutive code words included in the input signal of the converting means, so as to obtain a precoder output signal which is DC free, or includes a tracking pilot signal having a certain frequency. The precoder output signal is recorded on a record carrier.

In the example of q=1, the adding of a '0'-bit in the input signal of the converter results in the polarity of the output signal of the 1T precoder remaining the same. The adding of a '1'-bit results in a polarity inversion in the output signal of the 1T precoder. The merging means therefore influences the output signal of the 1T precoder such that the running digital sum value of the output signal of the 1T precoder can be controlled so as to have a desired pattern as a function of time.

BRIEF DESCRIPTION OF THE DRAWING

The invention will be further described in the following figure description, in which FIG. 3 shows various signals occurring in a prior art encoding device, FIG. 4 shows various signals occurring in the encoding device of FIG. 2, with one way of shuffling the composite source signal, FIG. 5 shows another way of shuffling the composite source signal, FIG. 6 a first embodiment of the shuffling unit in the encoding device, FIG. 13 shows again another way of shuffling the composite source signal.

DESCRIPTION OF THE PREFERRED EMBODIMENTS

Figure 1:
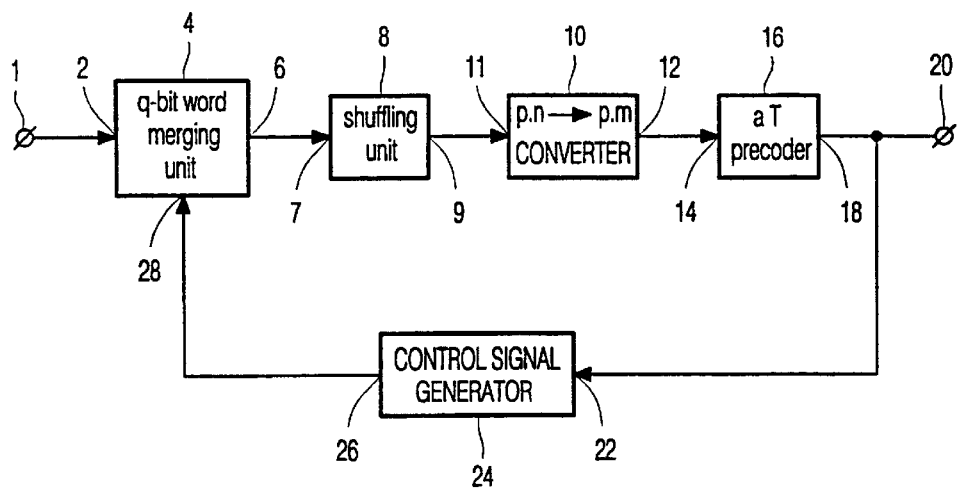
FIG. 1 shows a first and FIG. 2 shows a second embodiment of the encoding device.

FIG. 1 shows an embodiment of the encoding device in accordance with the invention. The device comprises an input terminal 1 for receiving a binary source signal, which terminal is coupled to an input 2 of a q-bit word merging unit 4. An output 6 of the unit 4 is coupled to an input 7 of a shuffling unit 8. The shuffling unit 8 has an output 9 which is coupled to an input 11 of a converter unit 10, which has an output 12 which is coupled to an input 14 of an aT precoder 16. An output 18 of the precoder 16 is coupled to an output for supplying a binary channel signal. The output 18 is also coupled to an input 22 of a control signal generator 24, which has an output 26 coupled to a control signal input 28 of the merging unit 4.

A binary source signal, in the form of a sequence of n-bit source words is applied to the input terminal 1 for encoding. The merging unit 4 is adapted to insert a q-bit merging word at equidistant positions in the binary source signal. More specifically, the merging unit 4 is adapted to insert a q-bit merging word each time between subsequent groups of x consecutive n-bit source words in the binary source signal so as to obtain a composite binary source signal at its output 6. x, n and q are integers, for which holds: $x>1$, $n=2q$ and $q>1$.

The composite binary source signal is applied to the input 7 of the shuffling unit 8, which carries out a shuffling step on each second group of x consecutive n-bit source words in the composite binary source signal, so as to obtain a shuffled composite source signal. The shuffled composite source signal is subsequently supplied to the input 11 of the converter unit 10. The encoding unit 10 carries out a conversion step on the shuffled composite source signal, which results into a channel signal. The conversion step includes the conversion of groups of p n-bit words in the shuffled composite source signal into corresponding groups of p m-bit channel words, said channel words forming the channel signal. This channel signal is supplied to the output 12. The binary channel signal is subsequently precoded into a precoded binary channel signal in the aT precoder 16 and the precoded binary channel signal is subsequently supplied to the output terminal 20, eg. for recording or transmission, as well as to the input 22 of the control signal generator 24. The control signal generator 24 generates a control signal at its output 26 in response to said precoded binary channel signal, which control signal is supplied to the control signal input 28 of the merging unit 4. The merging unit 4 chooses a q-bit word in response to said control signal for merging into the binary source signal.

The functioning of the device will be further explained with reference to FIG. 2, which shows a slightly modified version of the device of FIG. 1. The device of FIG. 2 comprises a merging unit 4' which is adapted to insert a 1-bit ($q=1$) merging word each time between subsequent groups of x consecutive n($=2$)-bit source words in the binary source signal so as to obtain a composite binary source signal at its output 6. x could have any integer value. In an example to be described later, x will be equal to 24, for the reason that a 1-bit merging word is inserted between subsequent groups of 6 bytes of the binary source signal.

The shuffling unit 8' in the embodiment of FIG. 2 will be described later. First, the functioning of the converter unit 10' will be explained. The converter 10' is adapted to convert groups of p 2-bit words in the shuffled composite source signal into corresponding groups of p 3-bit channel words of the channel signal. p is an integer and can vary, as will be made clear further below. The channel signal is precoded in a 1T precoder 16', well known in the art, so as to obtain the precoded channel signal. The output signal of the 1T-precoder 16' is applied to the control signal generator 24' which generates the control signal for the merging unit 4', so as to control whether a '0' or a '1' is inserted in the serial datastream of the source signal.

Figure 2:
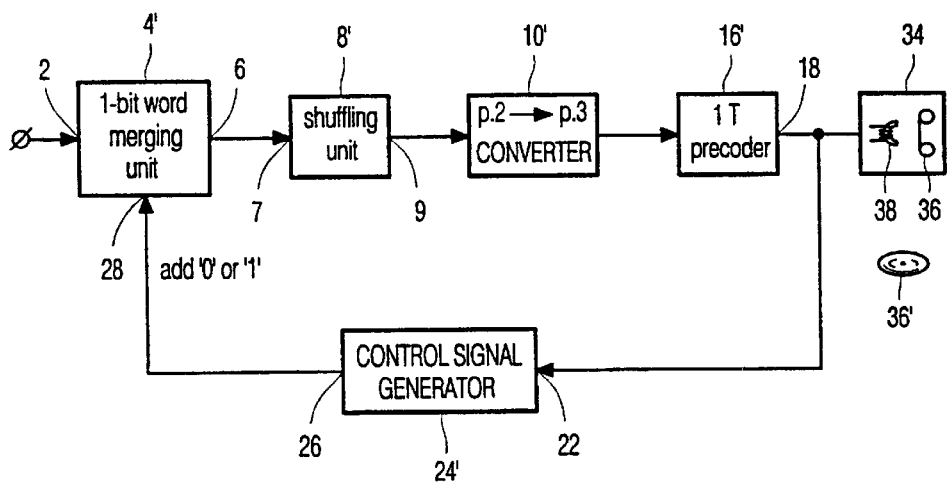

By means of the device shown in FIGS. 1 or 2, it is possible to embed a tracking tone of a certain frequency in the serial datastream of the precoded channel signal, or keep the DC content of the said datastream to zero. Further, when the converter unit 10' is adapted to generate a (d,k) sequence as explained above, it causes the output signal of the device of FIGS. 1 or 2 to be a (d,k) RLL output signal. Embodiments of the merging unit 4 are given in Bell System Technical Journal, Vol 53, No. 6, pp. 1103–1106.

The output signal of the 1T precoder 16' is supplied to a write unit 34 for writing the signal in a track on a record carrier 36. The record carrier 36 can be a magnetic record carrier in longitudinal or disk form. The record carrier could also be an optical record carrier, such as an optical disk 36'. The write unit 34 comprises a write head 38, which is a magnetic write head, when recording the signal on a magnetic record carrier or an optical write head, when recording the signal on an optical record carrier.

The functioning of the device of FIG. 2 will be explained hereafter. FIG. 3 shows in FIG. 3a schematically the binary source signal applied to the input terminal 1 of the device. The source signal comprises a sequence of 2-bit source words, denoted $sw_1, sw_2, \ldots sw_i, sw_{i+1}, \ldots$ Each time, four 2-bit source words of the binary source signal form a byte in the binary source signal. Sequence of each time six consecutive bytes $B_0, \ldots B_5$ are shown in FIG. 3a. The merging unit 4' of FIG. 2 is adapted to insert a 1-bit merging word each time between those groups of six consecutive bytes $B_0$ to $B_5$ in the binary source signal, that is: a 1-bit merging word is each time inserted between subsequent groups of 24 2-bit source words of the binary source signal. In the present example, a merging word $mw_0$ is merged between the source words $sw_2$ and $sw_3$ of the binary source signal and a merging word $mw_1$ is merged between the source words $sw_{i+3}$ and $sw_{i+4}$, resulting into the composite source signal shown in FIG. 3b.

In the prior art device, no shuffling of the composite source signal is realized and the composite source signal is transferred to the converter unit 10' without modification. The converter unit 10' converts 2-bit words in the composite source signal into corresponding 3-bit words. This is shown in FIG. 3c and FIG. 3d. FIG. 3c shows the composite source signal divided into a sequence of 2-bit words, the so-called composite source words, denoted $csw_1$, $csw_2$, $csw_3$ . . . Those composite source words are converted into corresponding 3-bit channel words, resulting in the channel signal shown schematically in FIG. 3d. The channel words in the channel signal are denoted $cw_1$. FIG. 3d shows the channel words $cw_2$, $cw_7$, $cw_{11}$ and $cw_i$, obtained from converting the 2-bit composite source words $csw_2$, $csw_7$, $csw_{11}$ and $csw_i$, respectively.

Upon reconversion in a corresponding decoding device, the 3-bit channel words are reconverted into replicas of the original 2-bit composite source words. This is schematically shown in FIG. 3e, which shows the sequence of the replicas of the composite source words, denoted $rcsw_1$, $rcsw_2$, $rcsw_3$, . . . $rcsw_i$. Next, the merging words $mw_0$ and $mw_1$, included in the replicas $rcsw_3$ and $rcsw_{i+4}$ are deleted from those replicas, resulting in the replica of the original source signal, shown schematically in FIG. 3f. FIG. 3f shows the replica of the source signal, in the form of a sequence of replicas of the original source words, those replicas being denoted in FIG. 3f by $rsw_1$, $rsw_2$, $rsw_3$ . . . , $rsw_i$, $rsw_{i+1}$, . . .

From the FIGS. 3b and 3c it is clear that, because of the insertion of the 1-bit merging words between the 2-bit source words in FIG. 3a, the boundaries between the 2-bit source words in the composite source signal of FIG. 3b do not always coincide with the boundaries between the 2-bit composite source words in FIG. 3c. More specifically, this statement is valid for the source words $sw_3$ to $SW_{i+3}$ in the signal of FIG. 3b.

Suppose now, that upon conversion and subsequent reconversion of the composite source word $csw_7$, an error occurs, resulting in an erroneous replica $rcsw_7$. The first bit of the word $rcsw_7$ is the seventh bit $b_7$ of the byte $B_0$ and the second bit in the word $rcsw_7$ is the first bit $b_0$ of the byte $B_1$ in the replica of the source signal of FIG. 3f. As the word $rcsw_7$ is erroneous, so are the bytes $B_0$ and $B_1$. Thus error propagation occurs, as an error in one word of the replica of the composite source signal results in an error in two bytes of the replica of the source signal.

In accordance with the invention, a shuffling step is carried out on the composite source signal, prior to supplying the composite source signal to the converter unit 10'. FIG. 4 shows one embodiment of this shuffling step and FIG. 5 shows another embodiment. FIG. 4a shows again the serial datastream of the binary source signal, in which a 1-bit merging word is inserted each time between subsequent groups of 24 2-bit source words. FIG. 4b shows again how a merging word $mw_0$ is inserted after the source word $sw_2$ and a merging word $mw_1$ is inserted before the source word $sw_{i+4}$. Further, a shuffling step is carried out on the signal obtained after merging the merging words. The result of the merging and shuffling step is shown by the signal of FIG. 4b, which shows the shuffled composite signal in the form of 2-bit words $w_1$, $w_2$, . . . $w_i$, $w_{i+1}$, . . . In addition to inserting the merging word $mw_0$, the sequence of 2-bit source words following the source word $sw_2$ is shifted to the right in FIG. 4b over an additonal bit position, resulting in an empty bit position between the merging word $mw_0$ and the word $w_4$ of the shuffled signal. Thus, the word $w_4$ in the shuffled signal equals the source word $sw_3$, the word $w_5$ in the shuffled signal equals the source word $sw_4$, and so on. Thus, the word $w_{i+3}$ which equals the source word $sw_{i+2}$. The last two bits of the byte $B_5$, the bits $b_6$ and $b_7$, are included in the source word $sw_{i+3}$. The bit $b_6$ directly follows the word $w_{i+3}$, as can be seen in FIG. 4b. The bit $b_7$, however, is repositioned and placed into the empty bit position between the merging word $mw_0$ and the word $w_4$. This is indicated in FIG. 4b by the arrow 50. The next merging word $mw_1$ is inserted as the second bit of the 2-bit word $w_{i+4}$, which is followed by the 2-bit word $sw_{i+5}$ which equals the source word $sw_{i+4}$, and so on. It is clear from FIGS. 4a and 4b that the boundaries between the words in the shuffled composite signal of FIG. 4b now coincide with the boundaries of the source words in the source signal of FIG. 4a.

Converting the 2-bit words of the shuffled composite signal into 3-bit channel words leads to the channel signal of FIG. 4c. Subsequent reconversion leads to a replica of the shuffled composite signal which is shown in FIG. 4d. Next, the merging words are deleted from the replica of the shuffled composite signal. That means: the first bit of the replica of the word $rw_3$ is deleted and the second bit of the word $rw_{i+4}$ is deleted. Further, the second bit of the word $rw_3$ is retrieved from the serial datastream, so that the word $rsw_3$ that follows the word $rsw_2$ of the replica of the source signal equals the 2-bit word $rw_4$ of the replica of the shuffled composite signal, and so on. Thus, the word $rsw_{i+2}$ of the replica of the source signal equals the word $rw_{i+3}$ of the replica of the shuffled composite signal and the word $rsw_{i+4}$ equals the word $rw_{i+5}$. The bit $b_6$ of the byte $B_5$ of the replica of the source signal equals the first bit of the word $rw_{i+4}$ of the replica of the shuffled composite signal. Deleting the merging word $mw_1$ means an empty bit position, which is filled in by the bit value of the second bit of the word $rw_3$, giving the bit $b_7$ of the byte $B_5$. This repositioning of the bit $b_7$ is shown in FIG. 4e by the arrow 52.

An error occurring during the conversion/reconversion step results in an erroneous word $rw_i$ in the replica of the shuffled composite signal of FIG. 4d. As the boundaries between the words $rw_i$ in the signal of FIG. 4d and the words $rsw_i$ in the signal of FIG. 4e are aligned, such error results in only one 2-bit word, and thus only one byte, to be erroneous, so that no error propagation occurs.

In the example of FIG. 4, it was the bit $b_7$ in the source word $sw_{i+3}$ that was repositioned to the position between the merging word $mw_0$ and the source word $sw_3$. Another possibility would have been to reposition the bit $b_6$ in the source word $sw_{i+3}$ into the position between the merging word $mw_0$ and the source word $sw_3$.

FIG. 5 shows another way of shuffling the composite source signal. FIG. 5a shows again the serial datastream of the binary source signal. FIG. 5b shows again how a merging word $mw_0$ is inserted after the source word $sw_2$ and a merging word $mw_1$ is inserted before the source word $sw_{i+4}$. The shuffling step now comprises repositioning the bit $b_0$ of the byte $B_0$, that is: the first bit of the word $sw_3$. The result of the merging and shuffling step is shown by the signal of FIG. 5b, which shows the shuffled composite signal in the form of 2-bit words $w_1$, $w_2$, . . . $w_i$, $w_{i+1}$, . . . The insertion of the merging word $mw_0$ in fact means a replacement of the bit $b_0$ of the byte $B_0$ by the merging word $mw_0$, whilst the bit $b_0$ is temporarily stored. Thus the following 2-bit words of the source signal remain in their original position. Or: the word $sw_4$ in the source signal equals the word $w_4$ in the shuffled composite signal, and so on. Thus, the word $sw_{i+3}$ of the source signal equals the word $w_{i+3}$ of the shuffled composite signal. Next, the bit $b_0$, that was temporarily stored, is now added as the first bit of the word $w_{i+4}$ and is followed by the merging word $mw_1$ as the second bit of the word $w_{i+4}$. This is schematically shown by the arrow 54 in FIG. 5b. The following source words $sw_{i+4}$, $sw_{i+5}$, . . . are shifted over two bit positions. But in all cases, the boundaries between the 2-bit words w in the shuffled composite signal of FIG. 5b and the source words sw in the source signal of FIG. 5a are aligned.

Converting the 2-bit words of the shuffled composite signal into 3-bit channel words leads to the channel signal of FIG. 5c. Subsequent reconversion leads to a replica of the shuffled composite signal which is shown in FIG. 5d. Next, the merging words are deleted from the replica of the shuffled composite signal. That means: the first bit of the replica of the word $rw_3$ is deleted and the second bit of the word $rw_{i+4}$ is deleted. The open bit position of the merging word $mw_0$ is filled by the bit value of the first bit of the word $rw_{i+4}$, resulting in the first bit of the 2-bit word $rsw_3$, and thus resulting in bit $b_0$ of the byte $B_0$ in the replica of the source signal. Further, the word $rsw_4$ that follows the word $rsw_3$ of the replica of the source signal equals the 2-bit word $rw_4$ of the replica of the shuffled composite signal, and so on. Thus, the word $rsw_{i+3}$ of the replica of the source signal equals the word $rw_{i+3}$ of the replica of the shuffled composite signal. The first bit of the word $rw_{i+4}$ was already repositioned into the first bit position of the word $rsw_3$. As a result, deleting the merging word $mw_1$ means that the words $rw_{i+5}$ (and so on) directly follow the word $rsw_{i+3}$ as the words $rsw_{i+4}$ (and so on) of the replica of the source signal. The repositioning of the bit $b_0$ is shown in FIG. 5e by the arrow 56.

An error occurring during the conversion/reconversion step results in an erroneous word $rw_i$ in the replica of the shuffled composite signal of FIG. 5d. As the boundaries between the words $rw_i$ in the signal of FIG. 5d and the words $rsw_i$ in the signal of FIG. 5e are aligned, such error results in only one 2-bit word, and thus only one byte, to be erroneous, so that no error propagation occurs.

In the example of FIG. 5, it was the bit $b_0$ in the source word $sw_3$ that was repositioned to the position between the source word $sw_{i+3}$ and the merging word $mw_1$. Another possibility would have been to reposition the bit $b_1$ in the source word $sw_3$ into the position between the source word $sw_{i+3}$ and the merging word $mw_1$.

Further, it should be noted that the shuffling step has been described as a step that follows the merging step. It should however be noted that the shuffling step could precede the merging step, or could coincide with the merging step.

Figure 6:
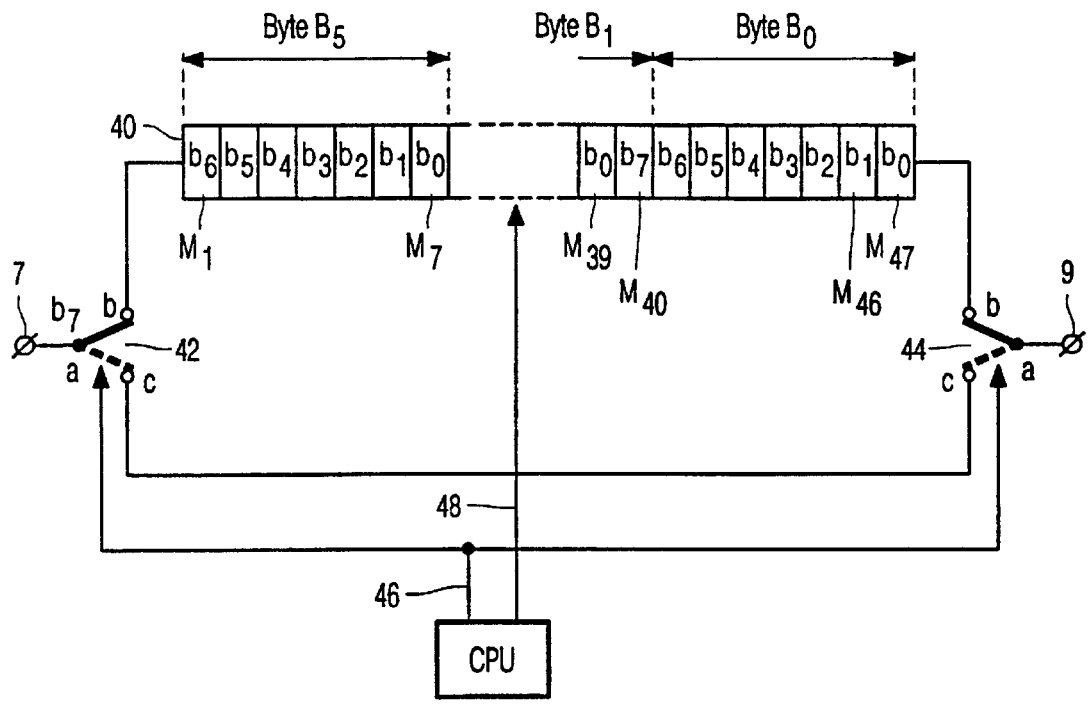

FIG. 6 shows an embodiment of the shuffling unit 8' for carrying out the shuffling step described with reference to the FIGS. 4a and 4b. The shuffling unit of FIG. 6 comprises a memory in the form of a shift register 40 having, in the example given, 47 storage locations. Further first and second controllable switches 42 and 44 are available having terminals a, b and c. Further, a control unit CPU is available for controlling the positions of the switches 42 and 44 via a control line 46 and for controlling the shifting of the information through the shift register 40 via a control line 48. The input 7 of the shuffling unit is coupled to the a-terminal of the switch 42. The b-terminal of the said switch is coupled to an input of the shift register 40. The c-terminals of the switches 42 and 44 are interconnected. An output of the shift register 40 is coupled to the b-terminal of the switch 44 and the a-terminal of the switch 44 is coupled to the output 9 of the shuffling unit.

The functioning of the shuffling unit of FIG. 6 is as follows. Under the influence of a control signal on the line 46, the switches 42 and 44 are both in their position a–b and under the influence of a control signal on the line 48, bits are stored in the first memory location $M_1$ of the shift register 40 and shifted further to the right in FIG. 6 in the shift register 40. It is assumed that the signal of FIG. 4a, with the merging bits included, is supplied to the input 7 of the shuffling unit. Storage of source words is carried out by storing the source word $sw_1$, and subsequent source words thereafter. Storing the information is continued until the source word $sw_1$ is stored in the memory locations $M_{47}$ and $M_{46}$, the source word $sw_2$ is stored in the memory locations $M_{45}$ and $M_{44}$ and the merging word $mw_0$ is stored in the memory location $M_{43}$. Five subsequent clock signals on the line 48 results in shifting the source words $sw_1$ and $sw_2$ and the merging word $mw_0$ out of the shift register 40, so that they are applied to the output 9. The shift register now has the byte $B_0$, formed by the source words $sw_3$ to $sw_6$, stored in the memory locations $M_{47}$ to $M_{40}$. The byte $B_1$, formed by the source words $sw_7$ to $sw_{10}$, is stored in the memory locations $M_{39}$ to $M_{32}$, and so on. The bits $b_0$ to $b_6$ of the byte $B_5$ are stored in the memory locations $M_7$ to $M_1$. Further, the bit $b_7$ of the byte $B_5$ now available at the input 7. FIG. 6 shows the situation at this moment.

Under the influence of the control signal on the line 46, the switches 42 and 44 now switch over to their positions a–c, so that the bit $b_7$ of the byte $B_5$ supplied to the output 9 for further processing in the converter unit 10'. Next, the switches 42 and 44 are again positioned into their position a–b, so that the bit $b_0$, stored in the memory location $M_{47}$, and the subsequent bits stored in the shift register 40, can be supplied to the output 9. Further the source word $sw_{i+4}$ and following source words are stored in the shift register 40. In this way, the bit $b_7$ of the byte $B_5$ actually inserted in the serial datastream of the shuffled composite signal between the merging word $mw_0$ and the bit $b_0$. This is done for each second group of 24 subsequent source words.

Figure 7:
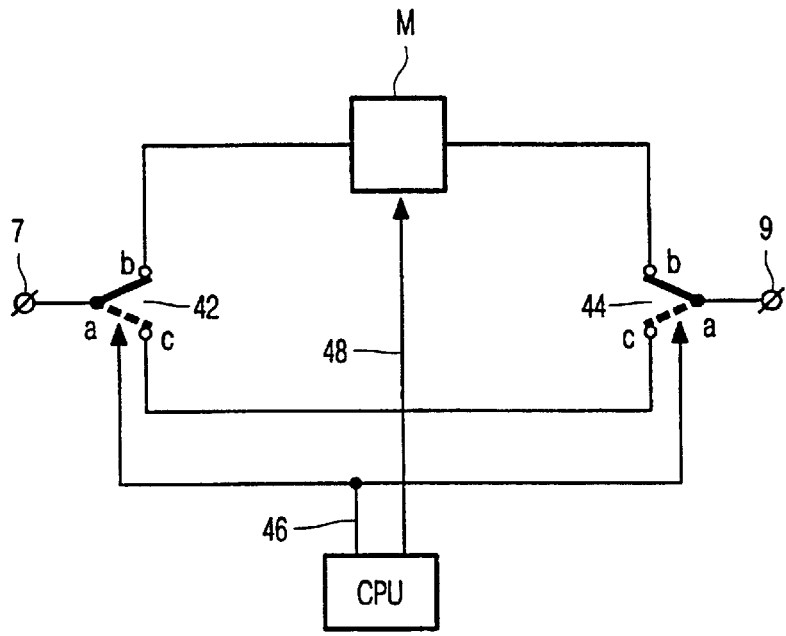
FIG. 7 shows a second embodiment of the shuffling unit.

FIG. 7 shows an embodiment of the shuffling unit 8' for carrying out the shuffling step described with reference to the FIGS. 5a and 5b. The shuffling unit of FIG. 7 comprises a memory M having one storage location. Further first and second controllable switches 42 and 44 are available having terminals a, b and c. Further, a control unit CPU is available for controlling the positions of the switches 42 and 44 via a control line 46 and for controlling the storage of information in the memory M via a control line 48. The input 7 of the shuffling unit is coupled to the a-terminal of the switch 42. The b-terminal of the said switch is coupled to an input of the memory M. The c-terminals of the switches 42 and 44 are interconnected. An output of the memory M is coupled to the b-terminal of the switch 44 and the a-terminal of the switch 44 is coupled to the output 9 of the shuffling unit.

The functioning of the shuffling unit of FIG. 7 is as follows. Under the influence of a control signal on the line 46, the switches 42 and 44 are both in their position a–c, so that the serial datastream of the source signal supplied to the input 7 is directly fed to the output 9. In this way, the source words $sw_1$ and $sw_2$ and the merging word $mw_0$ in the composite source signal are supplied to the output 9. Under the influence of the control signal on the line 46, the switch 42 is switched into its position a–b, at a time instant that the bit $b_0$ in the source word $sw_3$ appears at the input 7. Further, upon the influence of the control signal on the line 48, this bit $b_0$ is stored in the memory M. Next, uypon the appearance of the bit $b_1$ of the source word $sw_3$, the switch 42 is again switched into of the position a–c, so that the bits $b_1$, $b_2$, ... and so on of the byte $B_0$ can be supplied to the output 9. This continues until the source word $sw_{i3}$ appears at the input 7 and is supplied to the output 9. Next, under the influence of a control signal on the line 46, the switch 44 is switched into its position a–b, so that the bit $b_0$ of the source word $sw_0$ is supplied to the output. Next, under the influence of the control signal on the line 46, the switch 44 now switches over to its position a–c, so that the merging word $mw_1$ and subsequent source words $sw_{i+5}$, $sw_{i+6}$, ... and so on, appearing at the input 7, can be supplied to the output 9. In this way, the bit $b_0$ in the source word $sw_3$ in byte $B_0$ is actually inserted in the serial datastream of the shuffled composite signal between the source word $sw_{i+3}$ and the merging word $mw_1$. This is done for each second group of 24 subsequent source words.

Figure 8:
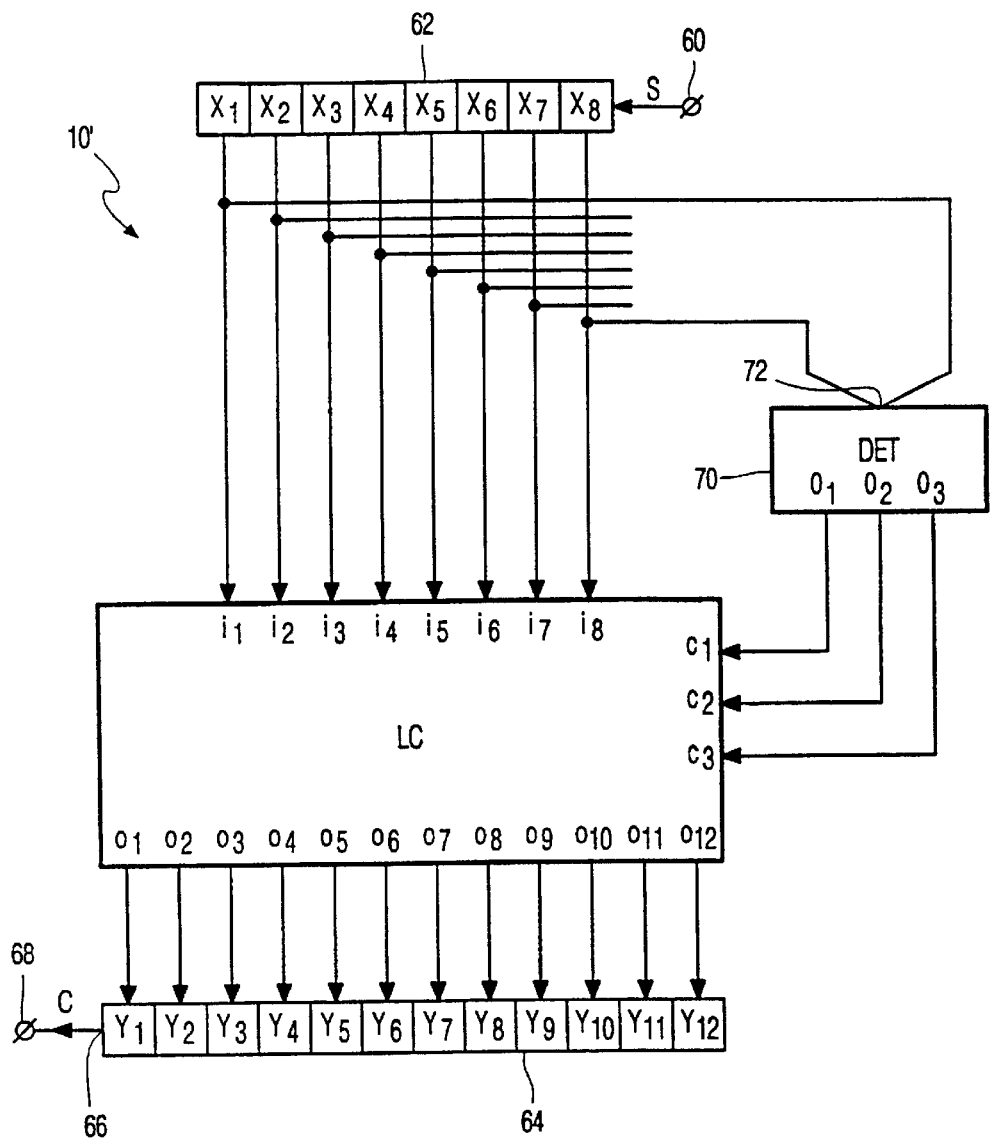
FIG. 8 shows a first embodiment of the conversion unit in the encoding device.

FIG. 8 shows a converter 10' that is capable of converting 2-bit words of the shuffled composite source signal into 3-bit channel words. The device described here is in fact the device also disclosed in U.S. Pat. No. 5,477,222, with further modifications to realize the objectives of a minimization of the repeated minimum transition runlength.

The converter 10' has an input 60, for receiving the stream of databits of the shuffled composite binary source signal S. The input 60 is coupled to an input of a shift register 62 having eight cells $X_1$ to $X_8$, in the present example, so as to receive eight consecutive bits of the shuffled composite source signal S. The shift register 62 functions as a serial-parallel convener. The outputs of the cells are coupled to corresponding inputs $i_1$ to $i_8$, respectively, of a logic circuit LC, for supplying the logic values $(x_1, \ldots, x_8)$ of the bits present in the cells.

The converter 10' further includes a second shift register 64 having twelve cells $Y_1$ to $Y_{12}$. The logic circuit LC has twelve outputs $o_1$ to $o_{12}$. Those outputs of the logic circuit LC are coupled to corresponding inputs of the twelve cells $Y_1$ to $Y_{12}$, respectively, of the shift register 64. An output 66 of the shift register 64 is coupled to an output 68. The shift register 64 functions as a parallel-serial converter, so as to obtain the binary channel signal C.

Further, a detector unit 70 is available for detecting specific sequences in the serial datastream of the source signal S. To that purpose, the outputs of the eight cells $X_1$ to $X_8$ of the shift register 62 are coupled to corresponding inputs, denoted 72, of the detector unit 70. In the present embodiment, the detector unit 70 has three outputs, denoted $o_1$, $o_2$ and $o_3$, for generating a first, second and third control signal, respectively. Those outputs are coupled to corresponding control signal inputs $c_1$, $c_2$ and $c_3$, respectively, of the logic circuit LC.

The functioning of the logic circuit LC in response to the control signals applied to its inputs $c_1$, $c_2$ and $c_3$, is as follows.

The logic circuit LC is capable of converting 2-bit source words $w_i$ of the shuffled composite source signal into 3-bit channel words, such that the conversion for each 2-bit source word is parity preserving. That means that the number of 'ones' in the 2-bit word to be converted equals the number of 'ones' in the corresponding 3-bit channel word, a modulo-2 addition on the 'ones' in the channel word being carried out. Or, otherwise said: if the number of 'ones' in the 2-bit word is even, the number of 'ones' in the 3-bit channel word will be even. And: if the number of 'ones' in the 2-bit word is odd, the number of 'ones' in the 3-bit channel word will be odd.

As an example, the converting means LC is adapted to convert the 2-bit words $w_i$ into 3-bit channel words $cw_i$ in accordance with the following table:

TABLE I

| word $w_i$ $(X_1, X_2)$ | channel word $cw_i$ $(Y_1, Y_2, Y_3)$ |
|---|---|
| 00 | 101 |
| 01 | 100 |
| 10 | 001 |
| 11 | 000 |

It should be noted here, that the first bit in the 2-bit word $w_i$ is applied first to the shift register 62 and that the first bit in the channel word is supplied first from the output 66 of the shift register 64.

It should be further noted here, that the logic circuit LC converts 2-bit words $w_i$ stored in the cells $X_1, X_2$ into 3-bit channel words $cw_i$ and stores those channel words in the cells $Y_1, Y_2, Y_3$, of the shift register 64, in response to an absence of any control signal at the control signal inputs $c_1, c_2$ and $c_3$. Each conversion in this way, is followed by a shift over two positions to the left in the shift register 62, and a shift over three positions to the left in the shift register 64. The shift over two positions in the shift register 62 is required so as to make the shift register 62, and thus the converter, ready for a subsequent conversion. The shift over three positions in the shift register 64 is required in order to output the 3-bit channel word $cw_i$ generated.

The converter 10' of FIG. 8 can be used to generate a channel signal C in the form of a (d,k) sequence satisfying the d=1 constraint. That means that at least one 'zero' is present between two subsequent 'ones' in the serial datastream of the channel signal. That is, that a concatenation of two or more 'ones' in the channel signal is prohibited.

It might occur that the unmodified conversion, such as by means of the converter of FIG. 8, of combinations of two subsequent 2-bit words $w_i$ might violate the d=1 constraint. Those combinations are the combinations; '00 00', which by unmodified conversion would lead to the two 3-bit channel words '101 101'; '00 01', which by unmodified conversion would lead to the two 3-bit channel words '101 100'; '10 00', which by unmodified conversion would lead to the two 3-bit channel words '001 101' and '10 01', which by unmodified conversion would lead to the two 3-bit channel words '001 100'.

The occurrence of such combinations should be detected so that a modified encoding of blocks of two 2-bit words $w_i, w_{i+1}$ into blocks of two 3-bit channel words $cw_i, cw_{i+1}$, can take place. Therefore, the converter of FIG. 8 is, in addition to the 'normal' encoding of 2-bit words $w_i$ into 3-bit channel words $cw_i$, capable of detecting the above identified combinations, and is capable of realizing a modified encoding, such that the d=1 constraint in the channel signal is still satisfied.

Because of the fact that the outputs of the cells $X_1$ to $X_4$ of the shift register 62 are coupled to corresponding inputs of the detector unit 70, this detector unit 70 is capable of detecting the position in the serial bitstream of the shuffled composite source signal where unmodified encoding of single 2-bit words $w_i$ in the bitstream into corresponding single 3-bit channel words $cw_i$ would lead to a violation of the d=1 constraint in the channel signal C, and are adapted to supply a control signal at its output $o_1$ in response to such detection.

More specifically, the detector unit 70 detects whether the cells $X_1$ to $X_4$ comprise one of the 4-bit sequences that are given in table II, and generates a first control signal at its output $o_1$. As soon as the detector circuit 70 detects a combination of two 2-bit words $w_i, w_{i+1}$ present in the four cell positions $x_1, x_2, x_3, x_4$, which combination equals one of the combinations given in the left hand column of table II, the logic circuit LC converts the combination in accordance with the modified coding as given in table II:

TABLE II

| words $w_i, w_{i+1}$ | unmodified coding | modified coding |
|---|---|---|
| 00 00 | 101 101 | 100 010 |
| 00 01 | 101 100 | 101 010 |
| 10 00 | 001 101 | 000 010 |
| 10 01 | 001 100 | 001 010 |

As can be seen from the table, unmodified conversion of the single two 2-bit words leads to a violation of the d=1 constraint, as two 'ones' occur at the boundary between the two channel words obtained. The logic circuit LC is therefore adapted to convert in a modified coding mode, the blocks of two 2-bit words given in the left column of the above table into the blocks of two 3-bit channel words as given in the right column in the above table II. As can be seen, no violation of the d=1 constraint occurs anymore. Moreover, the modified encoding in the same way is parity preserving. Further, one of the two 2-bit words, which is in the above table the second one, is encoded into a 3-bit channel word which is unequal to one of the four channel words of table I. The reason for this is that on the receiver side, a detection of this 3-bit channel word not belonging to the set of four 3-bit channel words of the table I is possible, so that a corresponding decoding, which is the inverse of the encoding as defined with reference to table II, can be realized.

The block of two 3-bit channel words obtained by means of the encoding in conformity with table II, is supplied by the logic circuit LC to its outputs $o_1$ to $o_6$, which channel words are supplied to the six cells $Y_1$ to $Y_6$ of the shift register 64.

It will further be clear that, a conversion of two 2-bit words into two 3-bit channel words by the converter unit LC, is followed by a shift over four positions to the left in the shift register 62 and a shift over six positions to the left in the shift register 64. The shift over four positions in the shift register 62 is required so as to make the shift register 62, and thus the converter, ready for a subsequent conversion. The shift over six positions in the shift register 64 is required in order to output the two 3-bit channel words generated.

The k-constraint in a (d,k) sequence means that a concatenation of at most k 'zeroes' between two subsequent 'ones' in the channel signal are allowed.

It might occur that the unmodified conversion of three subsequent 2-bit words might violate the k-constraint.

As an example: the sequence of 2-bit words '11 11 11' in the shuffled composite source signal would, by unmofidied conversion, lead to the three 3-bit channel words '000 000 000'. If a (d,k) sequence should be obtained where k equals 6, 7 or 8, such combination of three 3-bit channel words should not occur.

Another example is the sequence of 2-bit words '11 11 10' which by unmodified conversion would lead to the three 3-bit channel words '000 000 001'. This combination of three 3-bit channel words does not satisfy a k=6 or k=7 constraint. Moreover, this combination of three 3-bit channel words can follow a previous channel word that ends with a '0', so that it might lead to a violation of a k=8 constraint. Further, the combination ends with a '1', so that it might lead to a violation of the d=1 constraint, if the combination is followed by a 3-bit channel word that starts with a '1'. An equivalent reasoning is valid for the sequence of 2-bit words '01 11 11'.

A further example is the sequence of 2-bit words '01 11 10' which by unmodified conversion would lead to the three 3-bit channel words '100 000 001'. This combination can, in the same way as given above, lead to a violation of the d=1 constraint.

The occurrence of such combinations should be detected so that a modified encoding can take place. Therefore, the converter of FIG. 8 is, in addition to the 'normal' encoding of 2-bit words into 3-bit channel words, as well as the modified encoding in accordance with table II, capable of detecting the above identified combinations, and is capable of realizing a modified encoding, such that the k-constraint in the channel signal is still satisfied.

Because of the fact that the outputs of the cells $X_1$ to $X_6$ of the shift register 62 are coupled to corresponding inputs of the detector unit 70, this detector unit 70 is capable of detecting the position in the serial bitstream of the shuffled composite source signal where unmodified encoding would lead to a violation of the k-constraint in the channel signal C, and are adapted to supply a control signal at its output $o_2$ in response to such detection.

More specifically, the detector unit 70 detects whether the cells $X_1$ to $X_6$ comprise one of the 6-bit sequences that are given in table III, and generates a second control signal at its output $o_2$.

As soon as the detector circuit 70 detects a combination of three 2-bit words present in the six cell positions $x_1, x_2, x_3, x_4, x_5, x_6$, which combination equals one of the combinations given in the left hand column of table III, the logic circuit LC converts the combination in accordance with the modified coding as given in table III:

TABLE III

| 2-bit words | unmodified coding | modified coding |
|---|---|---|
| 11 11 11 | 000 000 000 | 000 010 010 |
| 11 11 10 | 000 000 001 | 001 010 010 |
| 01 11 10 | 100 000 001 | 101 010 010 |
| 01 11 11 | 100 000 000 | 100 010 010 |

The logic circuit LC converts in the second modification of the coding mode, the blocks of three 2-bit words given in the left column of the above table III into the blocks of three 3-bit channel words as given in the right column in the above table. By realizing the modified encoding as per table III, a channel signal has been obtained which satisfies the k=8 constraint. Moreover, the modified encoding in the same way is parity preserving. This means in the present situation that, if the number of 'ones' in the combination of three 2-bit words is odd (even), the number of 'ones' in the combination of the three 3-bit channel words obtained is odd (even). Further, two of the three 2-bit words, which is in the above table the second one and the third one, is encoded into a 3-bit channel word which is unequal to one of the four channel words of table I. The reason for this is that on the receiver side, a detection of these two consecutive 3-bit channel words not belonging to the set of four 3-bit channel words of the table I is possible, so that a corresponding decoding, which is the inverse of the encoding as defined with reference to table III, can be realized.

The block of three 3-bit channel words obtained by means of the encoding in conformity with table III, is supplied by the logic circuit LC to its outputs $o_1$ to $o_9$, which channel words are supplied to the nine cells $Y_1$ to $Y_9$ of the shift register 64.

It will further be clear that, a conversion of three 2-bit words into three 3-bit channel words by the converter unit LC, is followed by a shift over six positions to the left in the shift register 62 and a shift over nine positions to the left in the shift register 64. The shift over six positions in the shift register 62 is required so as to make the shift register 62, and thus the converter, ready for a subsequent conversion. The shift over nine positions in the shift register 64 is required in order to output the three 3-bit channel words generated.

A further requirement for encoding the shuffled composite source signal is that the repeated minimum transition runlength in the channel signal should be limited. The repeated minimum transition runlength is defined as the length of the sequence of subsequent transitions between '0' and '1', or: a sequence '. . . 01010101010 . . .', in the case where the d-constraint equals 1. As an example, the bit sequence '00 01 00 01' results, after modified conversion using table II, in the bit sequence '101 010 101 010'. In the same way, the bit sequence '10 01 00 01' results, after modified conversion using table II, in the bit sequence '001 010 101 010'. Such sequences deteriorate the bit detection in a receiver. Restriction of the length of 01-sequences is thus required.

Because of the fact that the outputs of the cells $X_1$ to $X_8$ of the shift register 62 are coupled to corresponding inputs of the detector unit 70, this detector unit 70 is capable of detecting the position in the serial bitstream of the shuffled composite signal where unmodified encoding would lead to a violation of the requirement that repeated minimum transition runlenght is limited and is adapted to supply a control signal at its output $o_3$ in response to such detection.

More specifically, the detector unit 70 detects whether the cells $X_1$ to $X_8$ comprise one of the 8-bit sequences that are given in table IV, and generates a third control signal at its output $o_3$.

As soon as the detector circuit 70 detects a combination of four 2-bit source words present in the eight cell positions $x_1,x_2,x_3,x_4,x_5,x_6,x_7,x_8$, which combination equals one of the combinations given in the left hand column of table IV, the logic circuit LC converts the combination in accordance with the modified coding as given in table IV into a 12-bit bitsequence as given in the right column of this table IV.

TABLE IV

| 8-bit bitsequence in source signal | 12-bit bitsequence in channel signal |
|---|---|
| 00 01 00 01 | 100 010 010 010 |
| 10 01 00 01 | 000 010 010 010 |

The modified conversion as per table IV is again aparity preserving.

It should be noted that the bitstream of the channel words is in NRZI (non-return to zero-inverse) notation, which means that a 'one' results in a transition in the write current for recording the channel signal on a magnetic record carrier.

In the foregoing, the situations where a modified encoding is required are detected by the detector unit 70 from the 2-bit words in ther shuffled composite source signal. It should however be noted that detection could be carried out on the channel words generated. Reference is made in this respect to FIG. 2b in U.S. Pat. No. 5,477,222.

Figure 9:
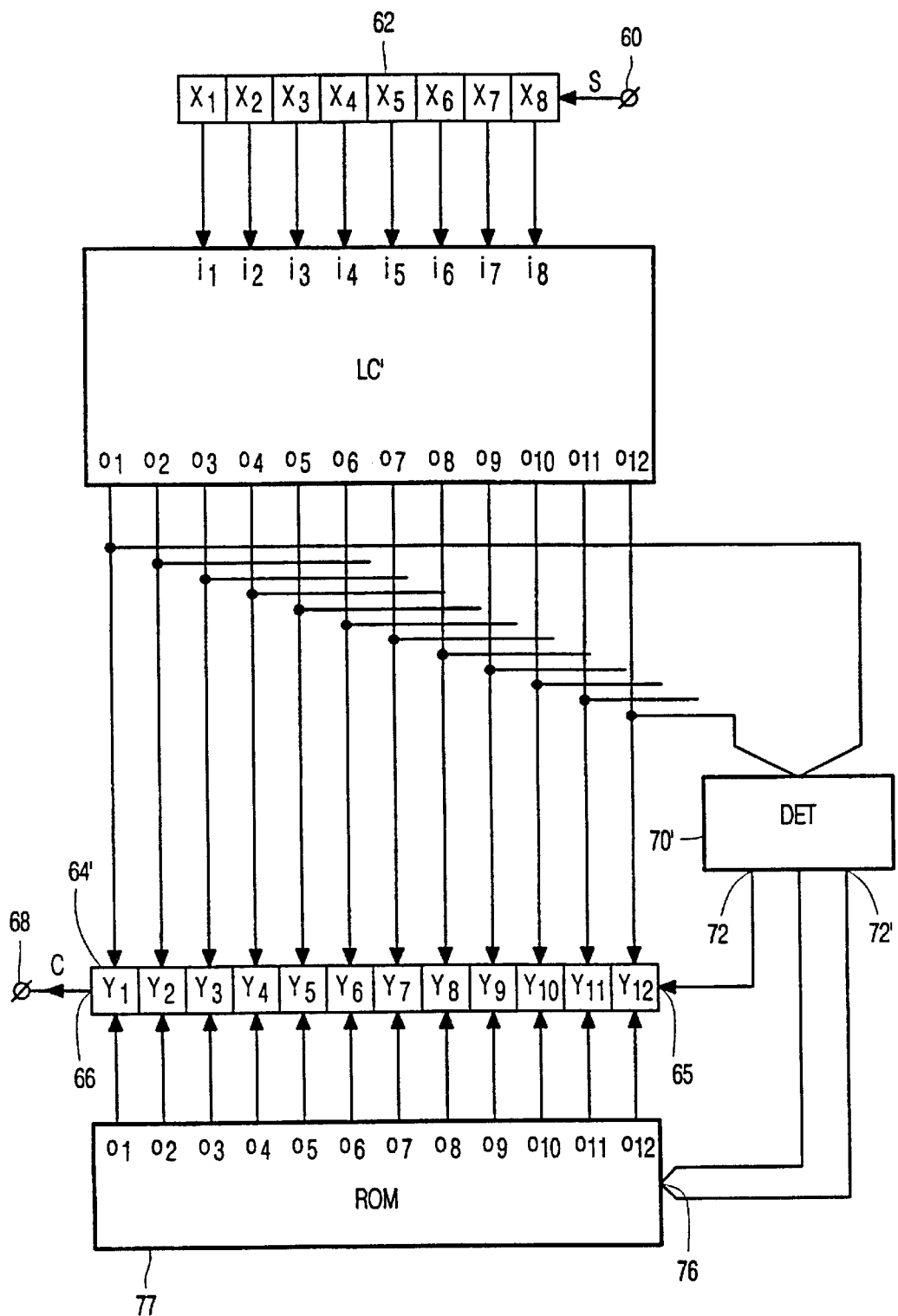
FIG. 9 shows a second embodiment of the conversion unit.

FIG. 9 shows another embodiment of the converter in which detection of the situations where a modified encoding is required is done based on the channel words generated by an unmodified coding as per table I.

The converter of FIG. 9 includes a detector 70' having 12 inputs for receiving the four subsequent 3-bit channel words obtained by means of an unmodified encoding as per table I in the circuit LC'. The detector 70' detects whether the two subsequent 3-bit channel words at the outputs $o_1$ to $o_6$ of the circuit LC', obtained using the unmodified coding, equal one of the four 6-bit sequences given in the middle column under 'unmodified coding' of table II. If so, the detector 70' issues a switching signal at its output 72 and an address signal AD at its output 72'. The switching signal is applied to a switching signal input 65 of the shift register 64'. The address signal AD is applied to an address signal input 76 of a ROM 77. The detector 70' generates one of four possible address signals AD1 to AD4, in response to the detection of a corresponding one of the four 6-bit sequences in the middle column of table II. As an example, the address signal AD1 is generated when the detector 70' detects the sequence '101101' and generates the address signal AD4 upon detection of the 6-bit sequence '001100'. The ROM 77 has the 6-bit sequences shown in the right column of table II stored. Upon the receipt of the address signal AD1, the ROM supplies the 6-bit sequence '100 010' at its outputs $o_1$ to $o_6$, and upon the receipt of the address signal AD2, the ROM supplies the 6-bit sequence '101 010' at those outputs. Upon the receipt of the address signal AD3, the ROM supplies the 6-bit sequence '000 010' at those outputs, and upon the receipt of the address signal AD4, the ROM supplies the 6-bit sequence '001 010' at those outputs. Each memory location of the shift register 64' has now two inputs, one of them being coupled with a corresponding output of the logic circuit LC', the other being coupled to a corresponding output of the ROM 77. In response to the switching signal applied to the input 75, the shift register accepts the information supplied to its lower inputs and shifts its contents over six positions to the left. As a result, a modified 6-bit sequence is supplied by the shift register 64' to the output 68.

The detector 70' also detects whether the three subsequent 3-bit channel words at the outputs $o_1$ to $o_9$ of the circuit LC', obtained using the unmodified coding, equal one of the four 9-bit sequences given in the middle column under 'unmodified coding' of table III. If so, the detector 70' issues a switching signal at its output 72 and an address signal AD at its output 72'. The detector 70' generates one of four possible address signals AD5 to AD8, in response to the detection of a corresponding one of the four 9-bit sequences in the middle column of table III. As an example, the address signal AD5 is generated when the detector 70' detects the sequence '000 000 000' and generates the address signal AD8 upon detection of the 9-bit sequence '100 000 000'. The ROM 77 has the 9-bit sequences shown in the right column of table III stored. Upon the receipt of the address signal AD5, the ROM supplies the 9-bit sequence '000 010 010' at its outputs $o_1$ to $o_9$, and upon the receipt of the address signal AD6, the ROM supplies the 9-bit sequence '001 010 010' at those outputs. Upon the receipt of the address signal AD7, the ROM supplies the 9-bit sequence '101 010 010' at those outputs, and upon the receipt of the address signal AD8, the ROM supplies the 9-bit sequence '100 010 010' at those outputs.

In response to the switching signal applied to the input 75, the shift register accepts the information supplied to its lower inputs and shifts its contents over nine positions to the left. As a result, a modified 9-bit sequence is supplied by the shift register 64' to the output 68.

The detector 70' further detects whether the four subsequent 3-bit channel words at the outputs $o_1$ to $o_{12}$ of the circuit LC', obtained using the unmodified coding, equal one of the following two 12-bit sequences: '101 010 101 010' or '001 010 101 010'. If so, the detector 70' issues a switching signal at its output 72 and an address signal AD at its output 72'. The detector 70' generates one of two possible address signals AD9 and AD10, respectively, in response to the detection of a corresponding one of the two 12-bit sequences given above. As an example, the address signal AD9 is generated when the detector 70' detects the sequence '101 010 101 010' and generates the address signal AD10 upon detection of the 12-bit sequence '001 010 010 101'. The ROM 77 has the 12-bit sequences shown in the right column of table IV stored. Upon the receipt of the address signal AD9, the ROM supplies the 12-bit sequence '100 010 010 010' at its outputs $o_1$ to $o_{12}$, and upon the receipt of the address signal AD10, the ROM supplies the 12-bit sequence '000 010 010 010' at those outputs.

In response to the switching signal applied to the input 75, the shift register accepts the information supplied to its lower inputs and shifts its contents over twelve positions to the left. As a result, a modified 12-bit sequence is supplied by the shift register 64' to the output 68.

In the normal situation, when none of the constraints is violated, unmodified conversion is carried out in accordance with table 1, and the switching signal is absent so that the shift register accepts the bits supplied by the logic circuit LC'via the upper inputs of the shift register 64'.

It has been said previously that other conversion rules for converting single 2-bit words into single 3-bit channel words are possible. Those conversion rules are given in the following three tables.

TABLE IV

| word $w_i$ $(x_1,x_2)$ | channel word $cw_i$ $(y_1,y_2,y_3)$ |
|---|---|
| 00 | 101 |
| 01 | 001 |
| 10 | 100 |
| 11 | 000 |

TABLE V

| word $w_i$ $(x_1,x_2)$ | channel word $cw_i$ $(y_1,y_2,y_3)$ |
|---|---|
| 00 | 000 |
| 01 | 100 |
| 10 | 001 |
| 11 | 101 |

TABLE VI

| word $w_i$ $(x_1,x_2)$ | channel word $cw_i$ $(y_1,y_2,y_3)$ |
|---|---|
| 00 | 000 |
| 01 | 001 |
| 10 | 100 |
| 11 | 101 |

It is evident that extensions of those conversion rules for encoding blocks of two, three or four 2-bit words into blocks of two, three or four 3-bit channel words, respectively, can be obtained using the teachings given above.

Figure 10:
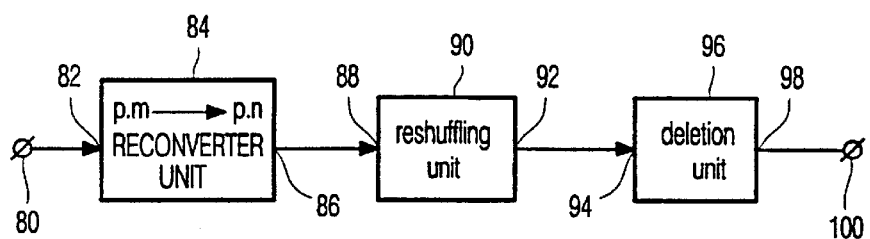
FIG. 10 shows a first embodiment of the decoding device.

FIG. 10 shows an embodiment of a decoding device for decoding the channel signal generated by the encoding device of FIG. 1 or 2 into a replica of the binary source signal. The decoding device has an input terminal 80 for receiving the channel signal, comprising a sequence of m-bit channel words. The input terminal 80 is coupled to an input 82 of a conversion unit 84, which has an output 86 coupled to an input 88 of a reshuffling unit 90. An output 92 of the reshuffling unit 90 is coupled to an input 94 of a deletion unit 96, which has an output 98 which is coupled to the output terminal 100 of the decoding device.

The reconverter unit 84 is adapted to convert subsequent blocks of p consecutive m-bit channel words in said channel signal into corresponding subsequent blocks of p consecutive n-bit words. The datasteam of n-bit words at the output 86 is a replica of the shuffled composite binary source signal, where q-bit merging words are present at equidistant positions in the shuffled composite binary source signal, and where subsequent q-bit merging words in said shuffled signal are separated by groups of x.n bits in said shuffled composite binary source signal. The reshuffling unit 90 is adapted to carry out a reshuffling operation on each second group of said groups of x.n bits in the said replica of the shuffled composite binary source signal, more specifically, by repositioning q bits of a second group of x.n bits into another position in the said group of x.n bits. This results in a replica of the composite binary source signal at the output 92. The deleting unit 96 deletes the q-bit merging words present in said replica of the composite binary source signal, resulting in a replica of the binary source signal at the output 98, which replica is supplied to the output terminal 100.

It should be noted that x is an integer larger than 1, n and q are integers for which holds n=2q and $q \geq 1$, m and p are integers for which holds m>n>1, $p \geq 1$, and where p can vary.

Further, the reshuffling operation comprises the step of repositioning said p bits such that the n-bit words in the replica of the composite binary source signal are aligned with the n-bit words in the replica of the binary source signal.

Figure 11:
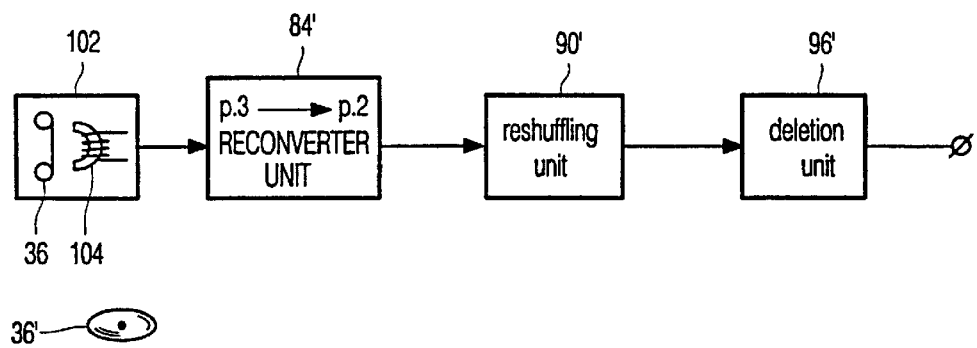
FIG. 11 shows a second embodiment of the decoding device.

FIG. 11 shows a slightly modified version of the decoding device of FIG. 10. The decoding device of FIG. 11 is for converting a channel signal comprising 3-bit channel words into a replica of the binary source signal comprising 2-bit source words. The channel signal is obtained from reading the channel signal from a track on a record carrier, which is either in the form of a magnetic record carrier 36 in longitudinal or disk form, or in the form of an optical record carrier, such as an optical disk 36'. A read unit 102 is therefore provided which comprises a read head 104, which is a magnetic read head, when recording the signal on a magnetic record carrier or an optical write head, when recording the signal on an optical record carrier.

The channel signal thus obtained is converted in the reconverter unit 84', which is adapted to convert subsequent blocks of p consecutive m-bit channel words in said channel signal into corresponding subsequent blocks of p consecutive n-bit words in said shuffled composite binary source signal. The reshuffling unit 90' is adapted to reshuffle 1-bit in each second group of x.n bits to another position, as per the shuffling shown in either the FIGS. 4*d* and 4*e* or the FIGS. 5*d* and 5*e*, so as to obtain the replica of the composite binary source signal. The deletion unit 96' deletes the 1-bit merging words from the replica of the composite binary source signal so as to obtain the replica of the binary source signal.

The reshuffling unit 90' for reshuffling the 1-bit $b_7$ into its original position, as shown in the FIGS. 4*d* and 4*e*, can be in the form of the shuffling unit shown in FIG. 7.

Under the influence of a control signal on the line 46, the switches 42 and 44 are both in their position a–c, so that the serial datastream of the replica of the shuffled composite source signal supplied to the input 7 is directly fed to the output 9. In this way, the words $rw_1$ and $rw_2$ and the merging word $mw_0$ are supplied to the output 9. Under the influence of the control signal on the line 46, the switch 42 is switched into its position a–b, at a time instant that the bit $b_7$ in the word $rw_3$ appears at the input 7. Further, upon the influence of the control signal on the line 48, this bit $b_7$ is stored in the memory M. Next, uypon the appearance of the word $rw_3$, the switch 42 is again switched into of the position a–c, so that the words $rw_3$, $rw_4$ . . . and so on can be supplied to the output 9. This continues until the word $rw_{i+4}$ appears at the input 7 and the bit $b_6$ in the said word is supplied to the output 9. Next, under the influence of a control signal on the line 46, the switch 44 is switched into its position a–b, so that the bit $b_7$ stored in the memory M is supplied to the output. Next, under the influence of the control signal on the line 46, the switch 44 now switches over to its position a–c, so that the merging word $mw_1$ and subsequent words $rw_{i+5}$, $rw_{i+6}$ , . . . and so on, appearing at the input 7, can be supplied to the output 9. In this way, the bit $b_7$ in the word $rw_3$ is actually inserted in its original position of the serial datastream of the replica of the composite binary source signal. This is done for each second group of 48 subsequent source bits in the replica of the shuffled composite binary source signal.

The reshuffling unit 90' for reshuffling the 1-bit $b_0$ into its original position, as shown in the FIGS. 5d and 5e, can be in the form of the shuffling unit shown in FIG. 6.

Under the influence of a control signal on the line 46, the switches 42 and 44 are both in their position a–b and under the influence of a control signal on the line 48, words $rw_i$ are stored in the shift register 40 and shifted further to the right in FIG. 6 in the shift register 40. Storage of words is carried out by storing the word $rw_j$, and subsequent words thereafter. Storing the information is continued until the word $rw_1$ is stored in the memory locations $M_{47}$ and $M_{46}$, the word $rw_2$ is stored in the memory locations $M_{45}$ and $M_{44}$ and the merging word $mw_0$ is stored in the memory location $M_{43}$. Five subsequent clock signals on the line 48 results in shifting the words $rw_1$ and $rw_2$ and the merging word $mw_0$ out of the shift register 40, so that they are applied to the output 9. The shift register now has the bit $b_1$ stored in the memory location $M_{47}$. Further, the bit $b_0$, in the word $rw_{i+4}$ is present at the input 7.

Under the influence of the control signal on the line 46, the switches 42 and 44 now switch over to their positions a–c, so that the bit $b_0$ is supplied to the output 9. Next, the switches 42 and 44 are again positioned into their position a–b, so that the bit $b_1$, stored in the memory location $M_{47}$, and the subsequent words $rw_4$, $rw_5$, . . . stored in the shift register 40, can be supplied to the output 9. In this way, the bit $b_0$ is actually inserted in its original position in the serial datastream of the replica of the composite signal. This is done for each second group of 48 subsequent source bits in the replica of the shuffled composite binary source signal.

It will be clear that, where in the example of FIG. 4 the bit $b_6$ in the source word $sw_3$ was repositioned in the shuffling step, a corresponding reshuffling step should be carried out to reposition the bit $b_6$ into its original position. Further, where in the example of FIG. 5, the bit $b_1$ was repositioned in the shuffling step, a corresponding reshuffling step should be carried out to reposition the bit $b_1$ into its original position.

Further, it should be noted that the reshuffling step has been described as a step that precedes the deletion step. It should however be noted that the reshuffling step could follow the deletion step, or could coincide with the deletion step.

Figure 12:
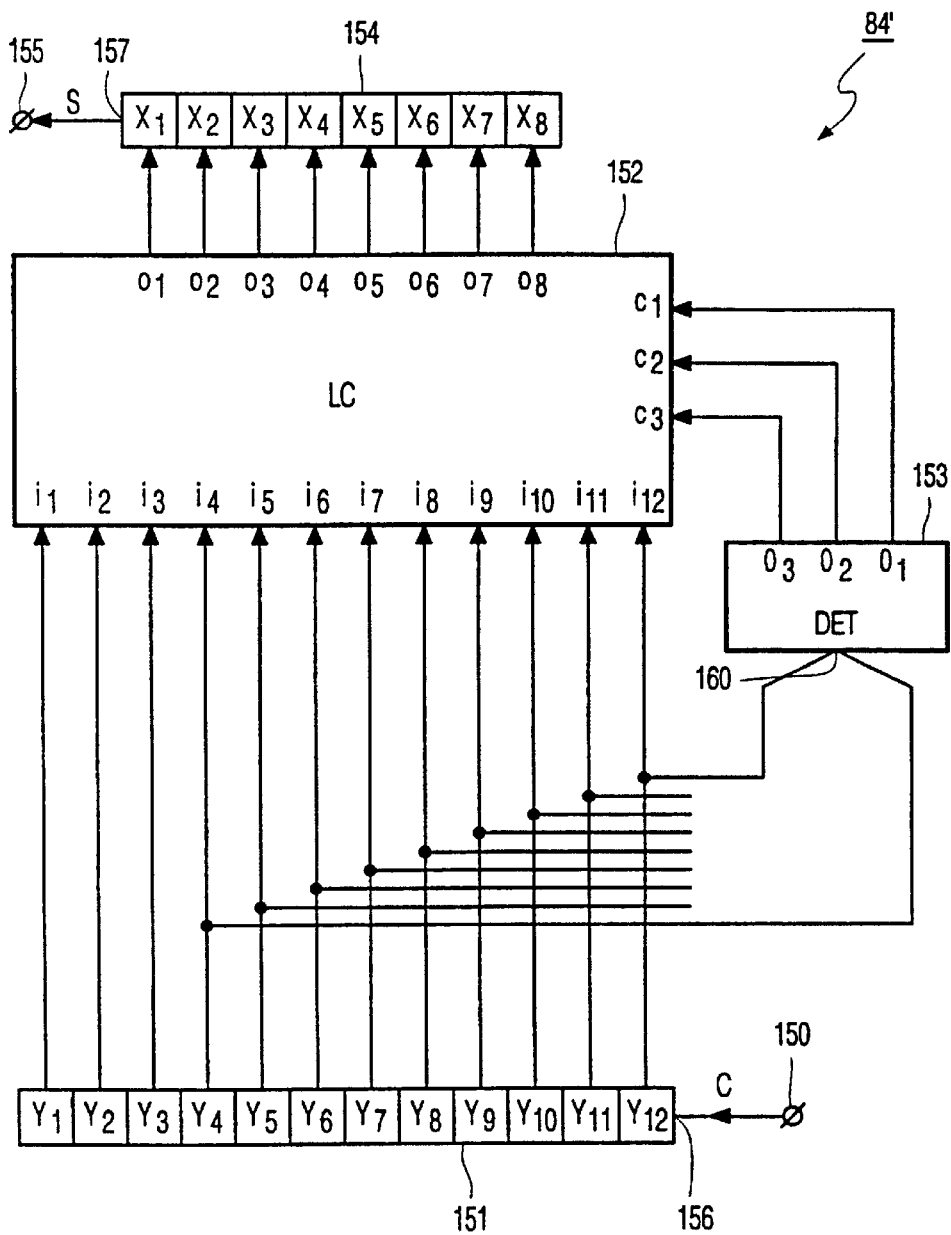
FIG. 12 shows an embodiment of the reconverter unit in the decoding device.

FIG. 12 shows an embodiment of the reconverter unit 84' of FIG. 11 for decoding the channel signal so as to obtain said replica of the shuffled composite binary source signal. The converter unit 84' has an input 150 for receiving the channel signal, which input terminal 150 is coupled to an input 156 of a shift register 151, comprising twelve cells $Y_1$ to $Y_{12}$. The shift register 151 functions as a serial-parallel convener so that blocks of four 3-bit channel words are applied to inputs $i_1$ to $i_{12}$ of a logic circuit 152. The logic circuit 152 comprises the four tables I, II, III and IV. Outputs $o_1$ to $o_8$ of the logic circuit 152 are coupled to inputs of cells $X_1$ to $X_8$ of a shift register 154, which has an output 157 coupled to an output terminal 155. A detector circuit 153 is present having inputs $i_1$ to $i_9$, schematically indicated by the reference number 160, coupled to outputs of cells $Y_4$ to $Y_{12}$ respectively of the shift register 151, and outputs $o_1$, $o_2$ and $o_3$ coupled to control inputs $c_1$, $c_2$ and $c_3$, respectively, of the logic circuit 152. The detector circuit 153 is capable of (a) detecting a '010 010 010' bit pattern in the cells $Y_4$ to $Y_{12}$ of the shift register 151, (b) detecting a bit pattern '010 010' in the cells $Y_4$ to $Y_9$ of the shift register 151, whilst the bits in the cells $Y_{10}$, $Y_{11}$ and $Y_{12}$ are unequal to '010', and (c) detecting a '010' bit pattern in the cells $Y_4$, $Y_5$ and $Y_6$, whilst the bits in the bitcells $Y_7$, $Y_8$ and $Y_9$ are unequal to '010'.

Upon detection of the '010 010 010' bitpattern, the detector circuit 153 generates a control signal on its output $o_1$, upon detection of the '010 010' bit pattern in the cells $Y_4$ to $Y_9$, the detector circuit 153 generates a control signal on its output $o_2$, upon detection of the '010' pattern in the cells $Y_4$ to $Y_6$, the detector circuit 153 generates a control signal at its output $o_3$, whilst, when there is no '010' bit pattern in the cells $Y_4$ to $Y_{12}$, it generates no control signal on its outputs.

In the absence of the control signals, the logic circuit 152 converts the 3-bit channel word stored in the cells $Y_1$, $Y_2$ and $Y_3$ into its corresponding 2-bit word, as per the conversion table I, and supplies the 2-bit word to the cells $X_1$ and $X_2$. In the presence of the control signal at the input $C_3$, the logic circuit 152 converts the block of two 3-bit channel words stored in the cells $Y_1$ to $Y_6$ into a block of two 2-bit words, as per the conversion table II, and supplies the two 2-bit words to the cells $X_1$ to $X_4$. In the presence of the control signal at the input $c_2$, the logic circuit 152 converts the block of three 3-bit channel words stored in the cells $Y_1$ to $Y_9$ into a block of three 2-bit words, as per the conversion table III, and supplies the three 2-bit words to the cells $X_1$ to $X_6$. In the presence of the control signal at the input $c_1$, the logic circuit 152 converts the block of four 3-bit channel words stored in the cells $Y_1$ to $Y_{12}$ into a block of four 2-bit words, as per the conversion table IV, and supplies the four 2-bit words to the cells $X_1$ to $X_8$.

In this way, the serial datastream of the channel signal is converted into the replica of the shuffled composite binary source signal.

FIG. 13 shows again another shuffling scheme that can be carried out on the source signal. In this embodiment, the shuffling is not done on the basis of groups of an integer number of the source words. In the present example, the shuffling is carried out on each second group of y bits of the source signal. In the present example, y=45, as can be seen in FIG. 13.

FIG. 13a shows again the serial datastream of the binary source signal. FIG. 13b shows how a merging word $mw_0$ is inserted before the source word $sw_1$ and a merging word $mw_1$ is inserted before the source word $sw_i$. The shuffling step now comprises repositioning the bit $b_4$ of the byte $B_5$, that is: the first bit of the word $sw_{23}$. The result of the merging and shuffling step is shown by the signal of FIG. 13b, which shows the shuffled composite signal in the form of 2-bit words $w_1, w_2, \ldots w_i, w_{i+1}, \ldots$ The insertion of the merging word $mw_0$ in fact means a shift of the source words in the source signal over two bit times, whilst the bit $b_4$ of the byte $B_5$ is stored in the second bit position of the word $w_1$.

This is schematically shown by the arrow 154 in FIG. 13b. The following source words $Sw_1, Sw_2, \ldots$ are shifted over two bit positions. In the third group of y bits shown in FIG. 13a, again the last bit of the group os shifted to a location in front of the first bit in the group. This is schematically shown by the arrow 154' in FIG. 13a and 13b.

In all cases, the boundaries between the 2-bit words w in the shuffled composite signal of FIG. 13b and the source words sw in the source signal of FIG. 13a are aligned.

Converting the 2-bit words of the shuffled composite signal into 3-bit channel words leads to the channel signal only schematically shown in FIG. 13c. Subsequent reconversion leads to a replica of the shuffled composite signal which is shown in FIG. 13d. Next, the merging words are deleted from the replica of the shuffled composite signal. That means: the first bit of the word $rw_1$ is deleted, the first bit of the word $rw_{24}$ and the first bit of the word $rw_{i+1}$, is deleted.

Further, the bit $b_4$ at the second bit position of the word $rw_1$ is repositioned to the first bit position of the word $rsw_{23}$, see the arrow 156, and the arrow 156' indicates the repositioning of the bit $b_1$ in the third group of 45 bits to its original position.

An error occurring during the conversion/reconversion step results in an erroneous word $rw_i$ in the replica of the shuffled composite signal of FIG. 13d. As the boundaries between the words $rw_i$ in the signal of FIG. 13d and the words $rsw_1$ in the signal of FIG. 13e are aligned, such error results in only one 2-bit word, and thus only one byte, to be erroneous, so that no error propagation occurs.

It should be noted that the shuffling step has been described as a step that follows the merging step. It should however be noted that the shuffling step could precede the merging step, or could coincide with the merging step.

Whilst the invention has been described with reference to preferred embodiments thereof, it is to be understood that these are not limitative examples. Thus, various modifications may become apparent to those skilled in the art, without departing from the scope of the invention, as defined in the claims. As an example, the converter unit of FIG. 12 could be modified into a converter unit in which the detector 153 detects the various modified decoding situations from the decoded information, instead of from the encoded information, as disclosed in FIG. 12.

Further, the invention lies in each and every novel feature or combination of features.

What is claimed is:

1. A device for encoding a stream of databits of a binary source signal into a stream of databits of a binary channel signal, the binary source signal comprising a sequence of consecutive n-bit source words and the binary channel signal comprising a sequence of consecutive m-bit channel words, the device comprising input means for receiving the binary source signal, merging means for receiving a first input signal that equals the binary source signal or a shuffled version thereof, and for merging a q-bit merging word each time between subsequent groups of y consecutive bits in said first input signal, in response to a control signal, control signal generator means for generating said control signal, shuffling means for receiving a second signal that equals said binary source signal or said binary source signal merged with said q-bit merging words in said merging means, and for carrying out a shuffling operation on each second group of said groups of y consecutive bits, the combined steps of merging in said merging means and shuffling in said shuffling means resulting in a shuffled composite binary source signal, comprising a sequence of n-bit words, y, n and q being integers for which holds: $y>1$, $n>1$ and $q \geq 1$, converting means for converting the shuffled composite binary source signal into said binary channel signal, by converting subsequent blocks of p consecutive n-bit words in said shuffled composite binary source signal into corresponding subsequent blocks of p consecutive m-bit channel words in said binary channel signal, m and p being integers for which hold: $m>n$, $p \geq 1$, and where p can vary output means for supplying said binary channel signal, the shuffling operation comprising the step of repositioning in each of said second groups of y consecutive bits, q bits in the group into another position in the said group, such that, except for the n-bit words comprising a merging word, the n-bit words in said shuffled composite binary source signal, required for conversion into m-bit channel words, are aligned with the n-bit source words in said shuffled composite binary source signal, and that $n=2q$.

2. A device as claimed in claim 1, wherein $y=x.n$, so that each group of y bits comprises x consecutive n-bit source words, where x is an integer larger than 1.

3. The device as claimed in claim 1, wherein the shuffling operation comprises the step of repositioning in a second group of y consecutive bits, the last q bits in the group of y consecutive bits into a position before the first bit in the said group of y consecutive bits.

4. The device as claimed in claim 2, wherein the shuffling operation comprises the step of repositioning in a second group of x consecutive n-bit source words, q bits of the last source word in the group of x consecutive source words into a position before the first n-bit source word in the said group of x consecutive source words.

5. The device as claimed in claim 4, wherein the shuffling operation comprises the step of repositioning in said second group of x consecutive n-bit source words, the last q bits of the last source word in the group of x consecutive source words into a position directly before the first n-bit source word in the said group of x consecutive source words.

6. The device as claimed in claim 1, wherein the shuffling operation comprises the step of repositioning in a second group of y consecutive bits, the first q bits in the group into a position after the last bit in the said group of y consecutive bits.

7. The device as claimed in claim 2, wherein the shuffling operation comprises the step of repositioning in a second group of x consecutive n-bit source words, q bits of the first source word in the group of x consecutive source words into a position after the last n-bit source word in the said group of x consecutive source words.

8. The device as claimed in claim 7, wherein the shuffling operation comprises the step of repositioning in said second group of x consecutive n-bit source words, the first q bits of the first source word in the group of x consecutive source words into a position directly after the last n-bit source word in the said group of x consecutive source words.

9. The device as claimed in claim 1 wherein said converting means is adapted to convert a block of p consecutive n-bit words in the shuffled composite binary source signal into a corresponding block of p consecutive m-bit channel words, such that the conversion for each block of p consecutive n-bit words of the shuffled composite binary source signal is parity preserving.

10. The device as claimed in claim 1 characterized in that, $m=3.n/2$.

11. The device as claimed in claim 10, characterized in that, $n=2$.

12. The device as claimed in claim 11, characterized in that, the device is adapted to convert single words in the shuffled composite binary source signal into corresponding single channel words in accordance with the following table:

| 2-bit word | channel word |
|---|---|
| 00 | 101 |
| 01 | 100 |
| 10 | 001 |
| 11 | 000. |

13. The device as claimed in claim 11 wherein the converting means are adapted to convert 2-bit words in the shuffled composite binary source signal into corresponding 3-bit channel words, so as to obtain a channel signal in the form of a (d,k) sequence, where d=1, the device further comprising means for detecting the position in the bitstream of the shuffled composite binary source signal where encoding of single 2-bit words into corresponding single channel words would lead to a violation of the d-constraint at the channel word boundaries and for supplying a control signal in response to said detection, characterized in that, in the absence of the control signal, the converting means are adapted to convert single 2-bit words in the shuffled composite binary source signal into corresponding single 3-bit channel words, such that the conversion for each 2-bit word is parity preserving.

14. The device as claimed in claim 13, wherein, in the presence of the control signal, occurring during the conversion of two consecutive words in the shuffled composite binary source signal, the converting means are adapted to convert a block of said two consecutive 2-bit words into a block of two corresponding 3-bit channel words, such that one of the two words in the block of 2-bit words is converted into a 3-bit channel word which is not identical to one of the four channel words used in converting single 2-bit words, in order to preserve the d=1 constraint, characterized in that, in the presence of said control signal, the converting means are further adapted to convert the block of said two subsequent 2-bit words into a corresponding block of two subsequent 3-bit channel words, such that the conversion for said block of two subsequent 2-bit words is parity preserving.

15. The device as claimed in claim 14, characterized in that, the converting means are adapted to convert the blocks of two consecutive 2-bit words into the blocks of two consecutive 3-bit channel words in accordance with the coding given in the following table:

| block of two 2-bit words | block of 2 channel words |
|---|---|
| 00 00 | 100 010 |
| 00 01 | 101 010 |
| 10 00 | 000 010 |
| 10 01 | 001 010. |

16. The device as claimed in claim 14, where k has a value larger than 5, the device being further provided with means for detecting the position in the bitstream of the shuffled composite binary source signal where encoding of single 2-bit words into single 3-bit channel words would lead to a violation of the k-constraint and for supplying a second control signal in response to said detection, characterized in that, in the presence of the second control signal, occurring during the conversion of three consecutive 2-bit words in the shuffled composite binary source signal, the converting means are adapted to convert a block of said three consecutive 2-bit words into a block of corresponding three consecutive 3-bit channel words, such that the conversion for said block of three 2-bit words is parity preserving, the converting means are further adapted to convert two of the three words in the block of three 2-bit words into corresponding 3-bit channel words not identical to the four channel words used for converting single 2-bit words, in order to preserve the k constraint.

17. Device as claimed in claim 16, characterized in that, the converting means are adapted to convert blocks of three consecutive 2-bit words into blocks of three consecutive 3-bit channel words in accordance with the coding given in the following table:

| block of three 2-bit words | block of 3 channel words |
|---|---|
| 11 11 11 | 000 010 010 |
| 11 11 10 | 001 010 010 |
| 01 11 10 | 101 010 010 |
| 01 11 11 | 100 010 010. |

18. A device for decoding a stream of databits of a binary channel signal into a stream of databits of a binary source signal, the device comprising
input means for receiving the binary channel signal,
reconverting means for converting the binary channel signal into a composite binary source signal, the reconverting means being adapted to convert the binary channel signal into a shuffled composite binary source signal by converting subsequent blocks of p consecutive m-bit channel words in said channel signal into corresponding subsequent blocks of p consecutive n-bit words in said shuffled composite binary source signal, q-bit merging words being present at equidistant positions in the shuffled composite binary source signal, subsequent q-bit merging words in said shuffled signal being separated by groups of y bits in said shuffled composite binary source signal,
reshuffling means for carrying out a reshuffling operation on each second group of y bits of the said shuffled composite binary source signal, by repositioning q bits of a second group of y bits into another position in the said group of y bits,
deleting means for deleting said q-bit merging words, the combined steps of shuffling in said shuffling means and deleting in said deletion means resulting in a binary source signal, comprising a sequence of n-bit source words, output means for supplying said binary source signal, wherein y is an integer larger than 1, n and q are integers for which holds n=2q and q≧1, m and p are integers for which holds m>n>1, p≧1, and where p can vary.

19. A device as claimed in claim 18, wherein y=x.n, so that each group of y bits comprises x consecutive n-bit source words, where x is an integer larger than 1.

20. The device as claimed in claim 18, wherein the reshuffling operation comprises the step of repositioning in a second group of y bits, the first q bits of the group of y bits into a position after the last bit in the said group of y bits (FIG. 4).

21. The device as claimed in claim 18, wherein the reshuffling operation comprises the step of repositioning in a second group of y bits in the shuffled signal, the first q bits of the group of y bits into a position before the last q bits in the said group of y bits.

22. The device as claimed in claim 18, wherein the reshuffling operation comprises the step of repositioning in a second group of y bits in the shuffled signal, the last q bits in the group of y bits into a position before the first bit in the said group of y bits (FIG. 5).

23. The device as claimed in claim 18, wherein the reshuffling operation comprises the step of repositioning in a second group of y bits in the shuffled signal, the last q bits in the group of y bits into a position after the first q bits in the said group of y bits.

24. Recording device for recording a channel signal in a track on a record carrier, the recording device comprising the encoding device as claimed in claim 1 and comprising writing means for writing the channel signal generated by said encoding device in said track on the record carrier.

25. Recording device as claimed in claim 24, wherein it further comprises 1T precoding means for precoding the channel signal prior to writing the channel signal on the track on the record carrier.

26. Record carrier obtained with the recording device as claimed in claim 24.

27. Record carrier as claimed in claim 26, wherein the record carrier is an optical record carrier.

28. Reproducing device for reproducing a channel signal from a track on a record carrier, the reproducing device comprising the decoding device as claimed in claim 18, and comprising reading means for reading the channel signal from the said track.

29. Method of encoding a stream of databits of a binary source signal into a stream of databits of a binary channel signal, the binary source signal comprising a sequence of consecutive n-bit source words and the binary channel signal comprising a sequence of consecutive m-bit channel words, the method comprising the steps of receiving the binary source signal, receiving a first input signal that equals the binary source signal or a shuffled version thereof, and merging a q-bit merging word each time between subsequent groups of y consecutive bits in said first input signal, in response to a control signal, generating said control signal, receiving a second signal that equals said binary source signal or said binary source signal merged with said q-bit merging words in said merging means, and carrying out a shuffling operation on each second group of said groups of y consecutive bits, the combined steps of merging and shuffling resulting in a shuffled composite binary source signal, comprising a sequence of n-bit words, y, n and q being integers for which holds: y>1, n>1 and q≧1, converting the shuffled composite binary source signal into said binary channel signal, by converting subsequent blocks of p consecutive n-bit words in said shuffled composite binary source signal into corresponding subsequent blocks of p consecutive m-bit channel words in said binary channel signal, m and p being integers for which hold: m>n, p≧1, and where p can vary supplying said binary channel signal, the shuffling operation comprising the step of repositioning in each of said second groups of y consecutive bits, q bits in the group into another position in the said group, such that, except for the n-bit words comprising a merging word, the n-bit words in said shuffled composite binary source signal, required for conversion into m-bit channel words, are aligned with the n-bit source words in said shuffled composite binary source signal, and that n=2q.

* * * * *